United States Patent [19]

Bhat et al.

[11] Patent Number: 5,596,743

[45] Date of Patent: Jan. 21, 1997

[54] FIELD PROGRAMMABLE LOGIC DEVICE WITH DYNAMIC INTERCONNECTIONS TO A DYNAMIC LOGIC CORE

[75] Inventors: Narasimha B. Bhat; Kamal Chaudhary, both of Berkeley, Calif.

[73] Assignee: Regents of the University of California, Oakland, Calif.

[21] Appl. No.: 369,291

[22] Filed: Jan. 6, 1995

Related U.S. Application Data

[63] Continuation of Ser. No. 70,102, May 28, 1993, abandoned.

[51] Int. Cl.⁶ ................................................ G06F 19/00
[52] U.S. Cl. ................... 395/500; 364/489; 364/DIG. 1; 364/DIG. 2
[58] Field of Search .................. 326/41–44; 395/500, 395/375, 325, 250, 275; 364/489

[56] References Cited

U.S. PATENT DOCUMENTS

| | | | |
|---|---|---|---|
| 3,987,286 | 10/1976 | Muehldorf | 235/152 |
| 4,422,072 | 12/1983 | Cavlan | 340/825.87 |
| 4,642,487 | 2/1987 | Carter | 326/41 |
| 4,703,206 | 10/1987 | Cavlan | 326/41 |
| 4,706,216 | 11/1987 | Carter | 365/94 |
| 4,758,985 | 7/1988 | Carter | 365/94 |
| 4,855,619 | 8/1989 | Hsieh et al. | 326/44 |
| 4,870,302 | 9/1989 | Freeman | 326/41 |
| 4,930,097 | 5/1990 | Ledenbach et al. | 364/716 |
| 4,992,680 | 2/1991 | Benedetti et al. | 307/465 |
| 5,015,885 | 5/1991 | El Gamal et al. | 326/38 |
| 5,027,315 | 6/1991 | Agrawal et al. | 395/275 |
| 5,036,473 | 7/1991 | Butts et al. | 364/489 |
| 5,075,576 | 12/1991 | Cavlan | 326/39 |
| 5,105,388 | 4/1992 | Itano et al. | 365/189.08 |
| 5,140,193 | 8/1992 | Freeman et al. | 307/465 |
| 5,185,706 | 2/1993 | Agrawal et al. | 364/489 |
| 5,317,209 | 5/1994 | Garverick et al. | 307/465 |
| 5,329,460 | 7/1994 | Agrawal et al. | 364/489 |

OTHER PUBLICATIONS

Dynamic Techniques for Yield Enhancement of field Programmable Logic Array, by Demjanenko et al, IEEE 1988, pp. 485–491.
Reduced Overhead by partitioning of a Circular–shift PLAs by Han et al, IEEE 1990 publication. pp. 1057–1060.
Brown, et al., *Field Programmable Gate Arrays*, Kluwer Academic Publishers, 1992, pp. 20–41.
Francis, Robert J., *A Tutorial on Logic Synthesis for Look-up–Table Based FPGAs*, Pro. Int. Conf. CAD (ICCAD–92), pp. 40–47, Nov. 1992.
Kuh, et al., "Recent Advances in VLSI Layout", Proc. IEEE, vol. 78, No. 2, pp. 237–263, Feb. 1990.

*Primary Examiner*—Parshotam S. Lall
*Assistant Examiner*—Zarni Maung
*Attorney, Agent, or Firm*—Flehr, Hohbach, Test, Albritton & Herbert

[57] ABSTRACT

The architecture, operation and design of a novel Field Programmable Logic Device is described. The device implements a circuit by using a dynamic logic core that executes staged logic corresponding to the logic levels of the implemented circuit. Logic inputs to the dynamic logic core are obtained from a dynamic interconnection array. Appropriate logic inputs for a given logic level are dynamically selected and routed by the dynamic interconnection array. When necessary, the dynamic interconnection array buffers signals which are required at subsequent logic levels. The dynamic interconnection array selects logic inputs for a given logic level from circuit input signals, buffered signals and dynamic logic core output signals.

16 Claims, 19 Drawing Sheets

LEVEL 1

| # | G |
|---|---|
| 0 | 0 |
| 1 | 1 |
| 2 | 1 |
| 3 | 1 |
| 4 | 1 |
| 5 | 1 |
| 6 | 1 |
| 7 | 1 |

Inputs: a, b, c → G

| # | H |
|---|---|
| 0 | 0 |
| 1 | 0 |
| 2 | 0 |
| 3 | 1 |
| 4 | 0 |
| 5 | 0 |
| 6 | 0 |
| 7 | 1 |

Inputs: d, e → H

LEVEL 2

| # | x |
|---|---|
| 0 | 0 |
| 1 | 1 |
| 2 | 1 |
| 3 | 0 |
| 4 | 0 |
| 5 | 1 |
| 6 | 1 |
| 7 | 0 |

Inputs: G, H → x

| # | y |
|---|---|
| 0 | 0 |
| 1 | 1 |
| 2 | 1 |
| 3 | 1 |
| 4 | 0 |
| 5 | 1 |
| 6 | 1 |
| 7 | 1 |

Inputs: H, c → y

FIELD PROGRAMMABLE LOGIC DEVICE WITH DYNAMIC INTERCONNECTIONS TO A DYNAMIC LOGIC CORE

This is a continuation of application Ser. No. 08/070,102, filed May 28, 1993, now abandoned.

BRIEF DESCRIPTION OF THE INVENTION

This invention relates generally to Field Programmable Logic Devices. More particularly, this invention relates to the architecture, operation and design of a Field Programmable Logic Device which utilizes dynamic interconnections to access a logic core which dynamically changes at staged logic levels.

BACKGROUND OF THE INVENTION

Programmable Logic Devices (PLDs) are widely used to implement logic functions for controlling electronic devices. A mask-programmable logic device is programmed by a manufacturer through the process of fabricating the device. In contrast, a field-programmable logic device is distributed by a manufacturer in an unprogrammed state. The purchaser of the device subsequently programs it in the "field" to execute a desired function. The present invention relates to field programmable logic devices (FPLDs). Field Programmable Gate Arrays (FPGAs) are one form of FPLDs.

The primary benefit of FPLDs is that user-programmability allows for rapid and inexpensive prototype development. Another important benefit associated with FPLDs is that they may be re-programmed to implement different designs.

Specific designs to be implemented within a given architecture are developed with Electronic Design Automation (EDA) techniques, also referred to as Computer Aided Design (CAD) techniques. EDA tools include logic synthesizers, physical design tools, and timing verifiers. Logic synthesizers convert a high-level description of a circuit into a netlist which describes circuit components and the connections between the components. Given a netlist, physical design tools determine physical locations of the components and the wire segments required for realizing the connections between the components. This step of the design process is generally computationally expensive. Consequently, refining this process is an ongoing matter.

Timing verifiers analyze the timing performance of the circuit described in the netlist. Based upon the timing performance of the circuit, an engineer may modify the netlist to improve the performance of the circuit.

It is desirable to completely automate the implementation of a given circuit into an FPLD architecture. For this to occur, it is important to design the FPLD architecture to insure that the EDA tools can accurately estimate the timing performance and also be able to place and route a given circuit design with ease. The FPLD architecture should have the foregoing features without eliminating the ability to implement complex circuits.

Look-Up Tables (LUTs) are generally used in FPGAs. A LUT is a digital device that provides an output value for a given set of input values. The output value is stored at a memory location which is addressed by the input values.

LUT-based FPGAs utilize a sequence of LUTs to form a multi-level structure. In such a device, the output from a first LUT is combined with new input values at a second LUT to yield a new output value. The second LUT may be viewed as a second logic level. Likewise, the output value from the second LUT may be subsequently combined with additional input values at a third LUT. In such a device, there are three logic levels with a LUT at each logic level.

There are a number of problems associated with traditional LUT-based FPGAs. As described in the preceding paragraph, these devices have a sequential structure in which the LUTs are distributed over the silicon die which implements the logic. This approach can be spatially expensive. Another problem relates to routing the connections between the various LUTs. The connections between the LUTs may introduce unpredictable and undesirable signal propagation delays. The propagation delays may require re-placement and re-routing of the circuit until all timing constraints are met. In some circumstances, it may be impossible to place and route a given circuit design on an FPGA to satisfy reasonable timing constraints.

OBJECTS AND SUMMARY OF THE INVENTION

It is a general object of the present invention to provide an improved architecture for a field programmable logic device.

It is a related object of the invention to provide a methodology for implementing a circuit design into the FPLD architecture of the invention.

It is another object of the invention to provide a field programmable logic device that utilizes a logic core that dynamically changes at staged logic levels.

It is another object of the invention to provide dynamic interconnections to access staged logic levels of a dynamically changing logic core.

It is another object of the invention to provide a field programmable logic device with improved timing performance which may be easily and accurately predicted before placement and routing.

It is still another object of the invention to provide a field programmable logic device architecture which greatly simplifies the process of placing and routing a circuit.

It is another object of the invention to provide a spatially compact field programmable logic device.

These and other objects are achieved by the architecture, operation and design of the novel Field Programmable Logic Device of the invention. The device implements a circuit by using a dynamic logic core that executes staged logic corresponding to the logic levels of the implemented circuit. Logic inputs to the dynamic logic core are obtained from a dynamic interconnection array. Appropriate logic inputs for a given logic level are dynamically selected and routed by the dynamic interconnection array. When necessary, signals which are required at subsequent logic levels are buffered by the dynamic interconnection array. The dynamic interconnection array selects logic inputs for a given logic level from circuit input signals, buffered signals and dynamic logic core output signals.

BRIEF DESCRIPTION OF THE DRAWINGS

For a better understanding of the nature and objects of the invention, reference should be made to the following detailed description taken in conjunction with the accompanying drawings, in which:

FIG. 9 depicts the logic tables or look-up tables associated with the circuit schematic of FIG. 8; these tables are implemented in the dynamic logic modules of the invention.

FIG. 15 depicts the logic tables or look-up tables associated with the circuit schematic of FIG. 14; these tables are implemented in the dynamic logic modules of the invention.

Like reference numerals refer to corresponding parts throughout the several views of the drawings.

DETAILED DESCRIPTION OF THE INVENTION

Figure 1:
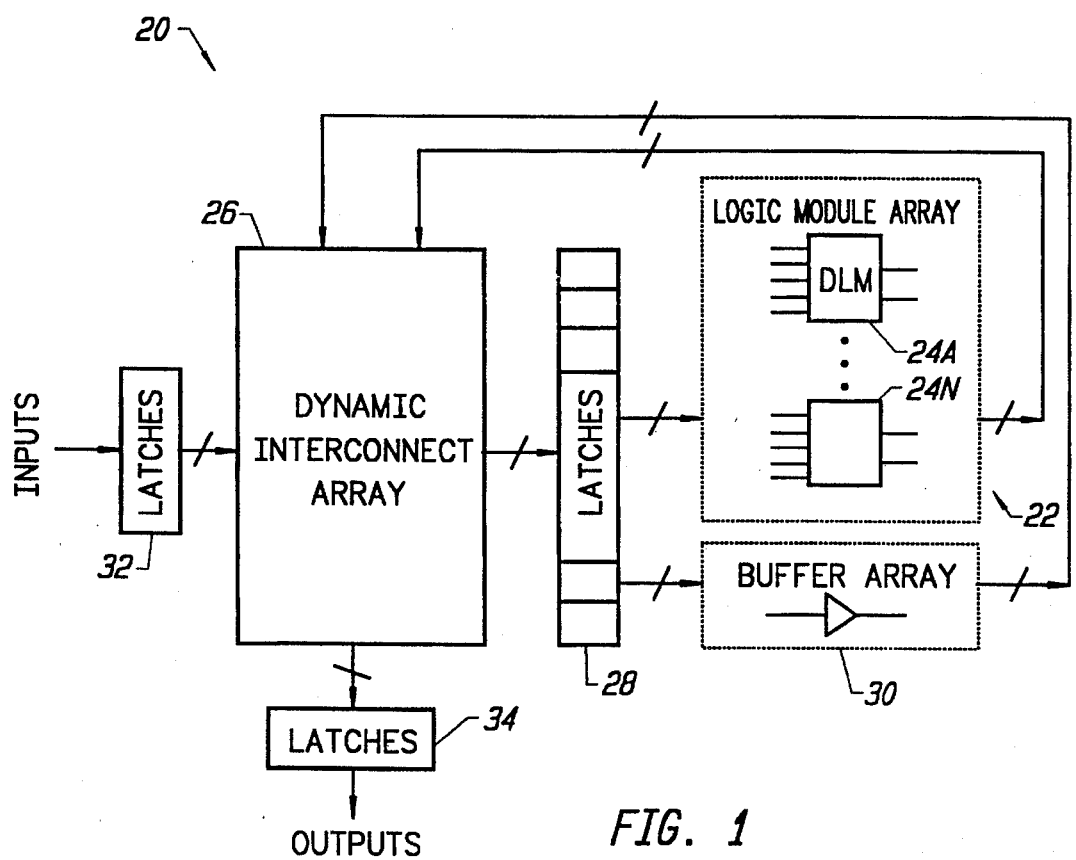
FIG. 1 is a high-level schematic representation of the FPLD of the invention.

FIG. 1 depicts a Field Programmable Logic Device (FPLD) 20 in accordance with the invention. The FPLD 20 includes a dynamic logic core 22 which includes an array of dynamic logic modules 24. As will be more fully described herein, each dynamic logic module 24 executes a set of logical operations. The set of logical operations includes a number of individual logic stages or levels. Each logic level corresponds to a logic level in a gate-level representation of a circuit which is implemented in the FPLD 20.

The dynamic logic core 22 is coupled to a dynamic interconnection array 26. The dynamic interconnection array 26 dynamically alters the connections to the dynamic logic core 22 so that each logic level of the logic core 22 receives the appropriate input signals. Since the same routing resources are used to implement the entire circuit, the present invention optimizes silicon resources. Another advantage of this technique is that the routing of the circuit is straightforward, and therefore the design automation of the circuit is simplified.

Interface latches 28 are provided between the dynamic logic core 22 and the dynamic interconnection array 26. A buffer array 30 is utilized to bypass selected logic levels of the dynamic logic core 22, as will be more fully described below. Finally, the FPLD 20 of the invention is implemented with the use of input latches 32 and output latches 34.

Figure 2:
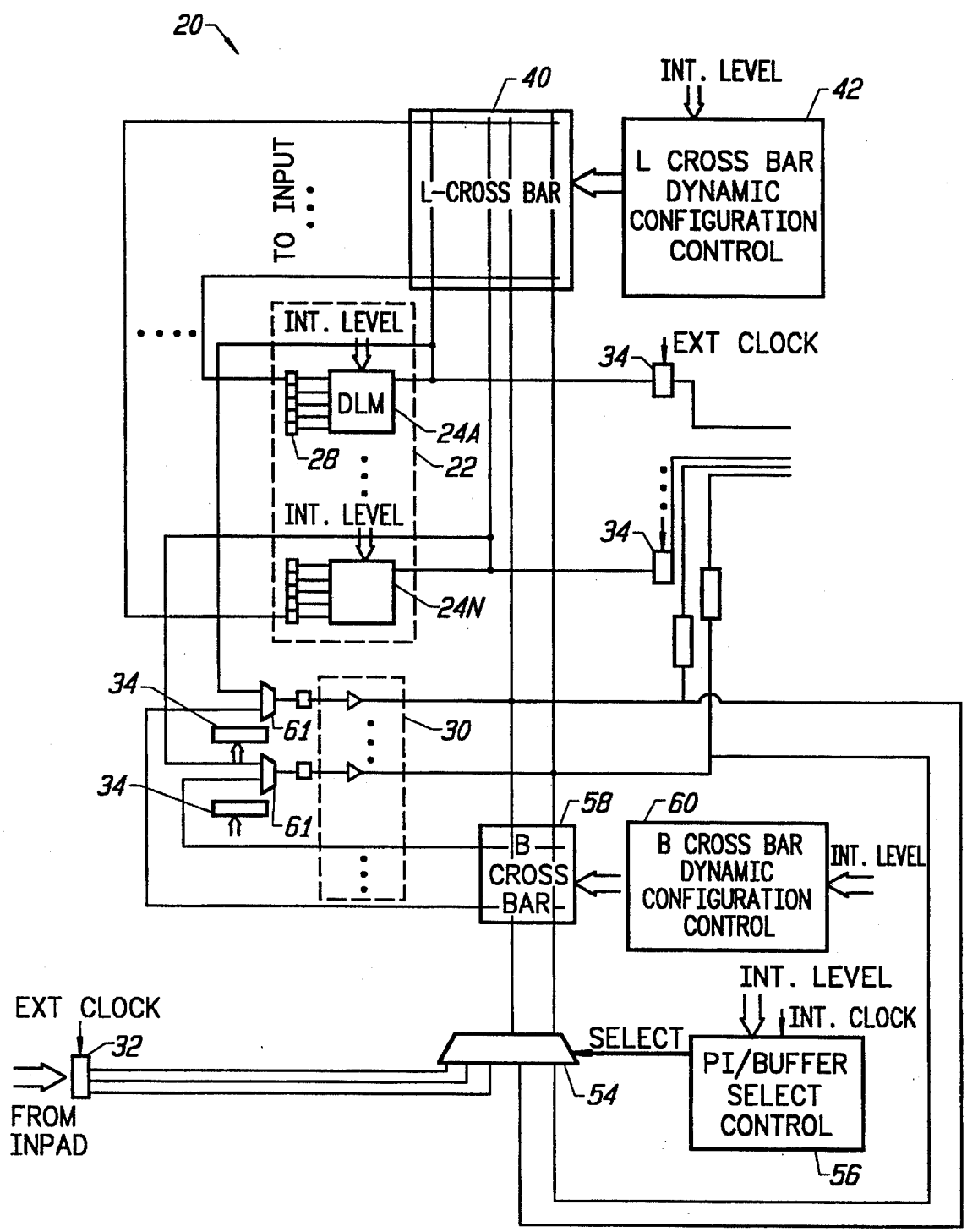
FIG. 2 is schematic of the FPLD of the invention.

FIG. 2 is a more detailed representation of the FPLD 20 of FIG. 1. The dynamic logic modules 24 are fed by a Logic Cross Bar (L-Cross Bar) module 40 which forms a portion of the dynamic interconnection array 26. As will be discussed below, the L-Cross Bar module 40 may be implemented in a number of ways. At the present time the L-Cross Bar module 40 should be viewed as a device for routing values which will eventually be conveyed to the dynamic logic modules 24. The L-Cross Bar module 40 is operated by an L-Cross Bar Dynamic Configuration Controller 42.

One input to the controller 42 is a "level" value. As will be more fully described below, the level value is the logic level of the circuit being implemented. This level value is used to determine appropriate control of the L-Cross Bar module 40.

Figure 3:
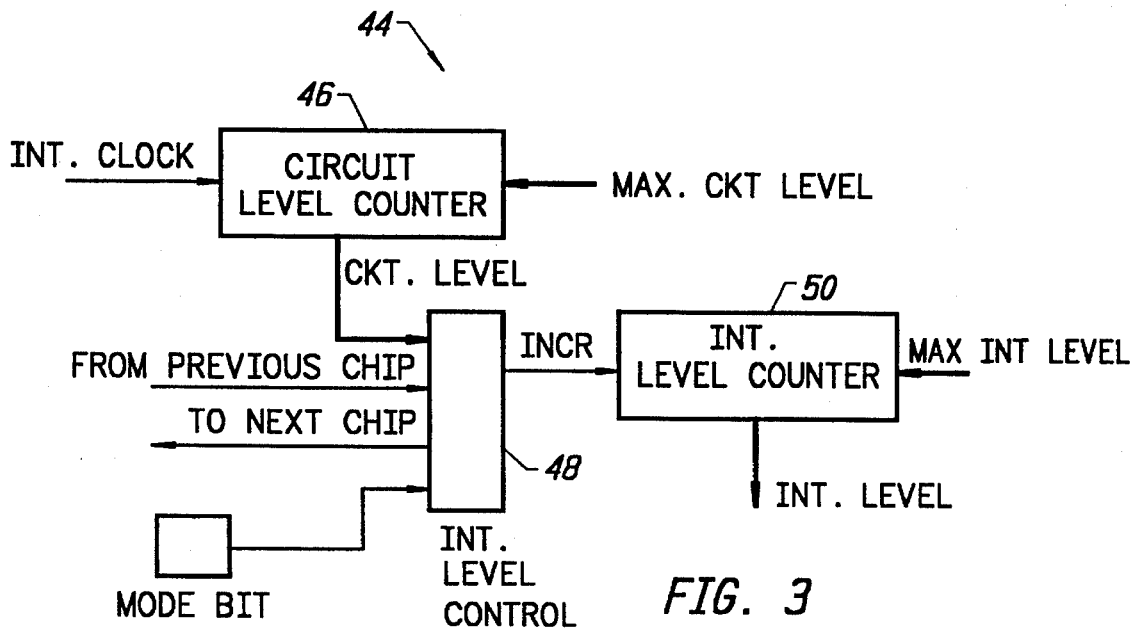
FIG. 3 depicts a level counter which may be used in conjunction with the invention.

FIG. 3 depicts a level counter control module 44 which may be used in accordance with the invention. The module 44 includes a counter 46 which tracks the circuit level. A controller 48 controls the operation of the internal level counter 50. If a multi-chip mode is selected for implementing the invention, as will be described below, then the controller 48 activates control to the next chip and uses signals from a previous chip. Otherwise, these signals are ignored. The internal level counter 50 is incremented or reset by the controller 48 based on the mode and the word stored in counter 46. The word in counter 50 is then sent to various devices within the FPLD 20, as depicted in FIG. 2.

The L-Cross bar 40 routes input values, buffer values, and outputs from the dynamic logic modules 24 into the dynamic logic modules 24. The L-Cross bar 40 dynamically changes the interconnections to the dynamic logic modules 24 for each level of the implemented circuit, as will be illustrated below. As depicted in FIG. 2, input latch 32 receives input values. The input values are then conveyed to a multiplexer 54. Multiplexer 54 also receives values from the buffer array 30. Selection of signals from the input or the buffer array 30 is controlled by a Primary Input/Buffer Select Controller 56.

The outputs of the multiplexer 54 are conveyed to a Buffer Cross bar module 58 (B-Cross bar). The B-Cross bar module 58 routes values which are present at a first logic level and which will also be required at a future logic level. Specifically, values which are to be bypassed to another logic level are conveyed from the B-Cross bar module to the buffer array 30. Multiplexers 61 are used to select a value from the B-Cross Bar module 58 or from an output value from the dynamic logic core 22, as will be described below. Latch 34 stores the control signals for multiplexer 61.

The B-Cross bar module 58 is controlled by B-Cross Bar Dynamic Configuration Controller 60. A logic level value forms an input to the B-Cross Bar Dynamic Configuration Controller 60. As indicated earlier, the level value corresponds to the logic level of the circuit being implemented. As depicted in the figure, values may bypass the B-Cross Bar 58 and be connected to the L-Cross Bar module 40. As previously stated, the values from the L-Cross Bar are then conveyed to the dynamic logic modules 24. The outputs of the dynamic logic modules 24 are conveyed to output latches 34 after all logic levels have been executed.

Figure 4:
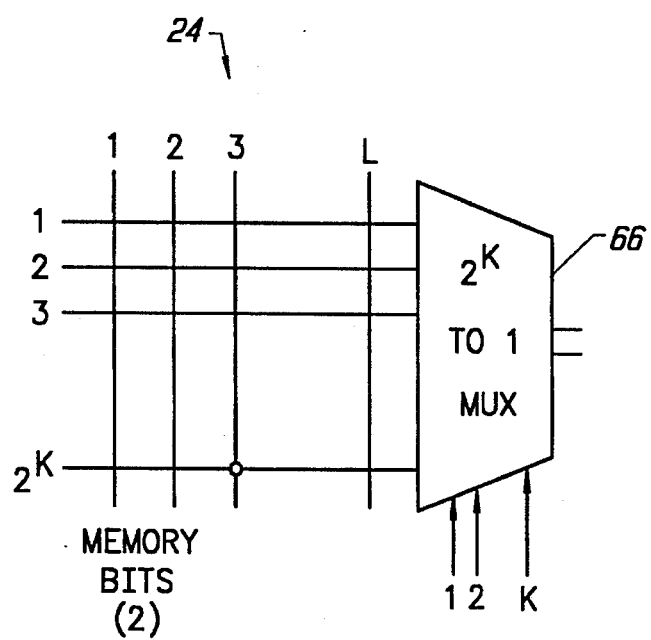
FIG. 4 depicts a dynamic logic module used in accordance with the invention.

FIG. 4 depicts a dynamic logic module 24 in accordance with the invention. Dynamic logic modules may be implemented using look-up tables, multiplexer based modules, or a combination thereof. Look-up based modules are preferred in the present invention because they allow the implementation of all combinational functions for a set of input values. Look-up tables may have single or multiple outputs.

FIG. 4 depicts a dynamic logic module 24 in the form of a K-input, 2-output LUT. The K-input value may be viewed as the number of address lines for the LUT. Thus, if K equals 3, then the module 24 is implemented in the form of a LUT with 3 address lines. In addition to input values, the level input is required. As previously stated, the level corresponds to the logic level of a circuit which is being implemented. Once the input and level are set up, multiplexer 66, through its select lines, is used to select an appropriate logic bit(s).

The dynamic logic module 24 requires $L \times 2^K$ bits of memory per output. "L" corresponds to the upper limit on the number of levels that can be implemented on a given FPLD device. There are many ways in which the level select lines and the K address lines can be combined together. The particular technique for a given implementation of the architecture depends on area usage and memory read time, which depends on the technology being used.

The overall architecture of the invention has now been described. Attention now turns to the construction and operation of this architecture. The construction and operation of the invention will be initially described at a general level. Thereafter, the construction and operation of the invention will be specifically detailed in reference to several examples.

Figure 5:
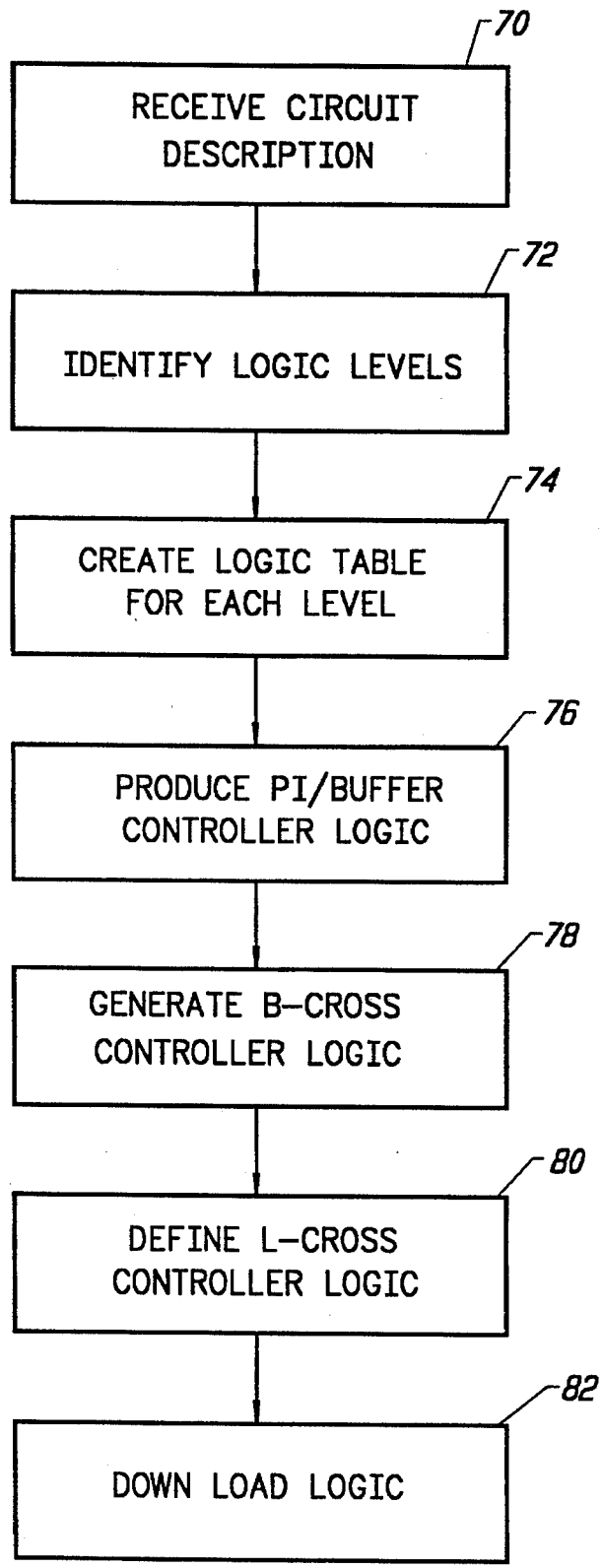
FIG. 5 represents the processing steps associated with implementing a design into an FPLD in accordance with the invention.

FIG. 5 depicts the processing steps associated with implementing a circuit design onto a FPLD architecture of the invention. The first step associated with the process is to receive a circuit description (block 70). Generally, the circuit description will be in the form of a Hardware Description Language, a Register Transfer Language, or a circuit schematic description, all known to those skilled in the art.

The next step associated with the process is to identify the various logic levels within the circuit (block 72). This step is performed in conjunction with known logic synthesis techniques.

Circuits may be divided into a number of logic levels. That is, a set of input signals are initially processed by a first set of circuit components to generate a first level of output values. The first level output values, and perhaps some of the initial input signals, are then passed to a second set of circuit components. This processes is repeated through a number of logic levels. Specific illustrations of this operation are described below.

The next step associated with the process is to create a logic table for each logic level (block 74). In this step, a logic table is created to define the logical operation performed by the logic modules at each logic level.

The next step in the process is to produce logic for the PI/Buffer Controller (block 76). The logic created results in a set of multiplexer select values which are conveyed to the multiplexer 54 at different processing stages (logic levels). For example, when a value from the buffer array 30 at a first logic level is to be passed for processing at a second logic level, an appropriate select signal would be generated to allow the signal to pass through multiplexer 54.

Generating B-Cross controller logic is the next step (block 78) of the process. In this step, logic is generated which will allow the B-Cross bar 58 to route a value which is subsequently buffered during the execution of a logic stage.

The next step of the process is to define L-Cross controller logic (block 80). In this step, logic is defined to allow the L-Cross bar 40 to route a value which is subsequently latched to the dynamic logic core 22.

After the foregoing logic is defined at steps 74, 76, 78 and 80, it is downloaded (block 82) into a configuration memory 99. Once downloaded, the logic may be executed, as will be illustrated below.

Figure 6A:
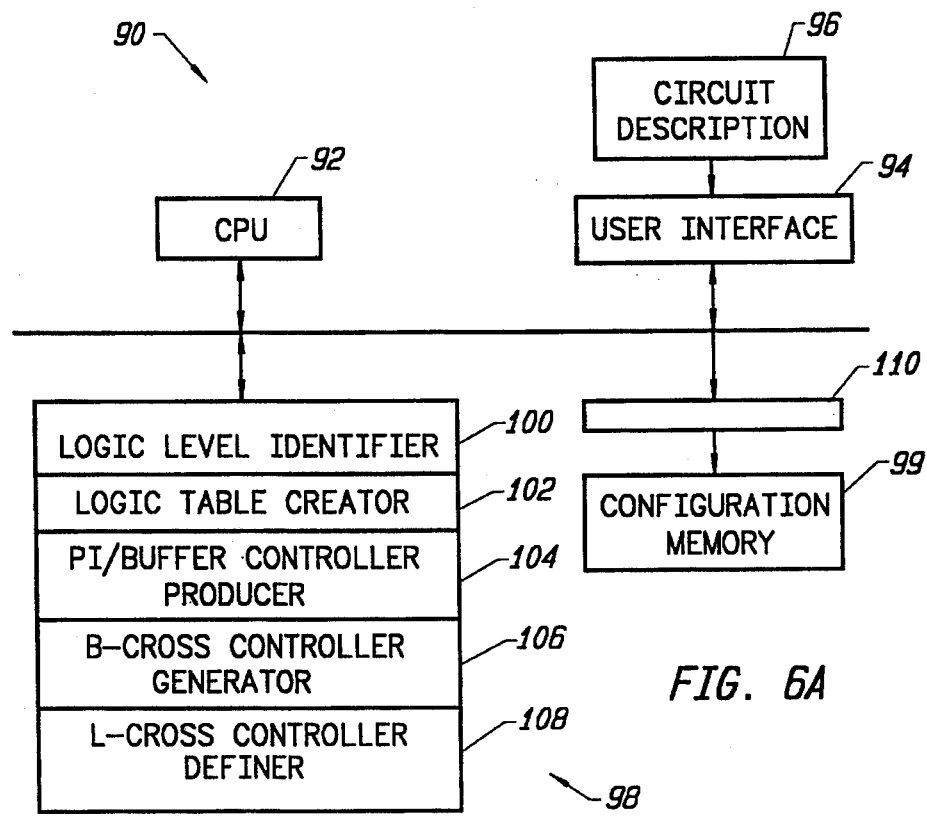
FIG. 6A depicts an apparatus which may be used to execute the processing steps of FIG. 5.

FIG. 6A depicts an apparatus 90 which may be used to execute the process of FIG. 5. The apparatus 90 includes a Central Processing Unit (CPU) 92 which is coupled through a bus 93 to a user interface 94. The user interface 94 is any combination of known computer input and output devices, such as a keyboard, mouse, scanner, monitor, printer, etc. The user interface 94 receives a description of a circuit 96 which is to be implemented in the FPLD of the invention.

The CPU 92 executes a number of programs stored in memory 98. These programs will generally supplement logic synthesizers of the type known in the art.

The CPU 92 executes a logic level identifier 100 (corresponding to step 72), a logic table creator 102 (corresponding to step 74), a PI/Buffer controller producer (corresponding to step 76), a B-Cross controller generator 106 (corresponding to step 78), and an L-Cross controller definer (corresponding to step 80). These modules respectively generate logic levels, logic tables, PI/Buffer logic, B-Cross controller logic, and L-Cross controller logic.

At the direction of the CPU 92, the generated logic is downloaded into non-volatile configuration memory 99 through an appropriate interface 110. Interfaces for storing values in field programmable logic devices are known in the art.

Figure 6B:
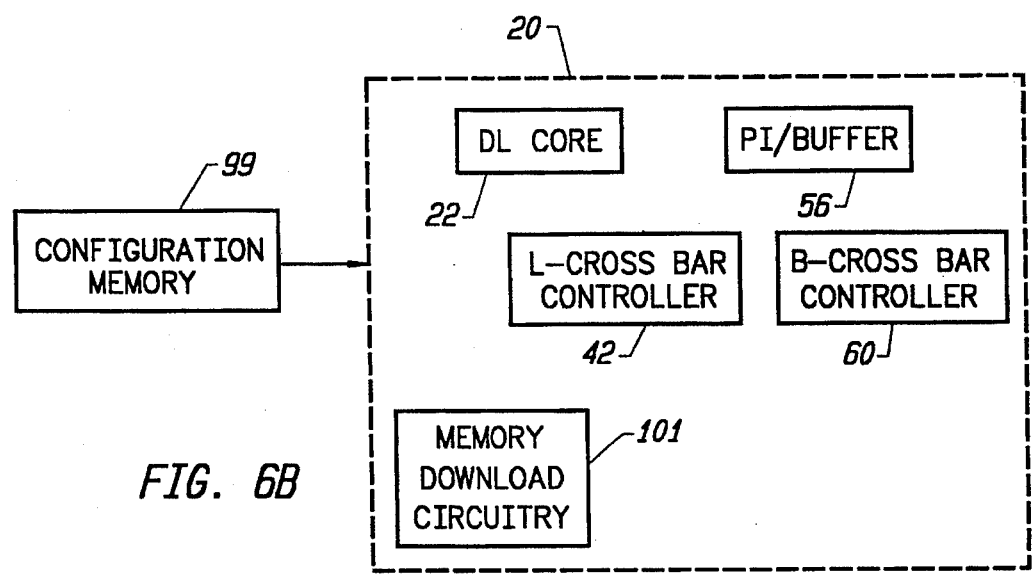
FIG. 6B depicts the relationship between the downloaded logic generated by the apparatus of FIG. 6A and an FPLD which subsequently utilizes the downloaded logic.

FIG. 6B depicts the relationship between the non-volatile configuration memory 99 and the FPLD 20 of the invention. In particular, after non-volatile configuration memory 99 is loaded with the appropriate logic values, it may be used independent of apparatus 90. Specifically, the non-volatile configuration memory 99 is coupled to the FPLD 20. Standard memory download circuitry 101 is used on the FPLD 20 to coordinate the reception of the logic values from the non-volatile configuration memory 99. As depicted in FIG. 6B, FPLD 20 receives logic for the dynamic logic core 22, the L-Cross bar controller 42, the PI/Buffer controller 56, and the B-Cross bar controller 60.

Figure 7:
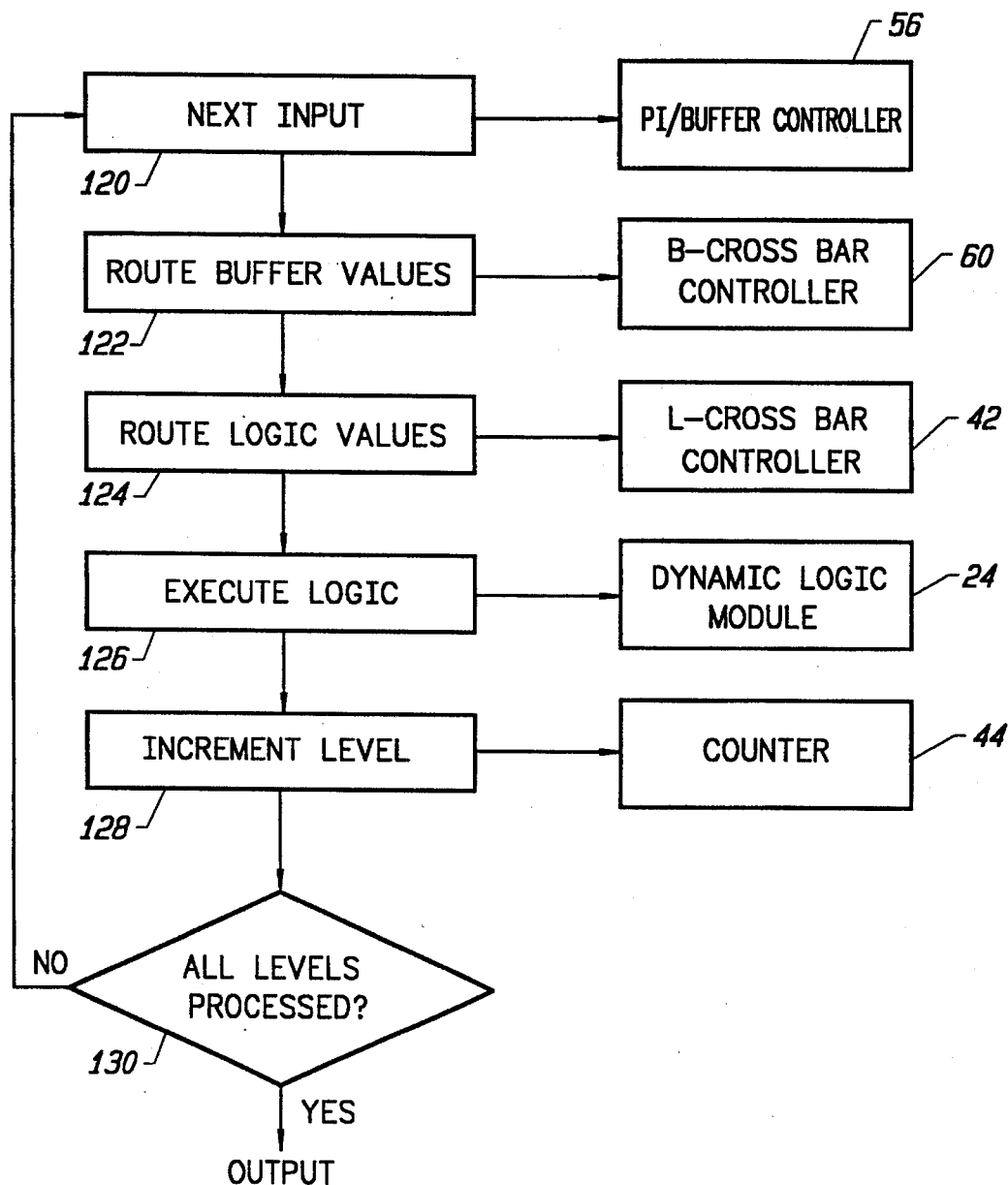
FIG. 7 depicts the control sequence associated with the operation of the FPLD of the present invention.

FIG. 7 depicts the processing steps associated with the operation of the FPLD 20 of the invention. The first step of the process is to read an input value (block 120). The input values are obtained through multiplexer 54 which is controlled by PI/Buffer select controller 56. Thereafter, buffer values (block 122) and logic values (block 124) are routed. The buffer values are routed by the B-Cross bar controller 60 and the logic values are routed by the L-Cross bar controller 42. These operations are generally performed simultaneously, although they are depicted in FIG. 7 as being sequential operations.

The next processing step associated with the FPLD of the invention is to execute the logic (block 126), for a given stage or logic level, which is within the dynamic logic module 24. Simultaneously, the logic level is incremented (block 128) through counter 4 and a decision is made to determine whether all logic levels are processed (decision block 130). Steps 126, 128, and 130 of FIG. 7 are preferably performed in parallel, although they are depicted as sequential operations in FIG. 7 for the sake of illustration. If all logic levels are processed, an output value is generated. Otherwise, processing once again commences at block 120.

Figure 8:
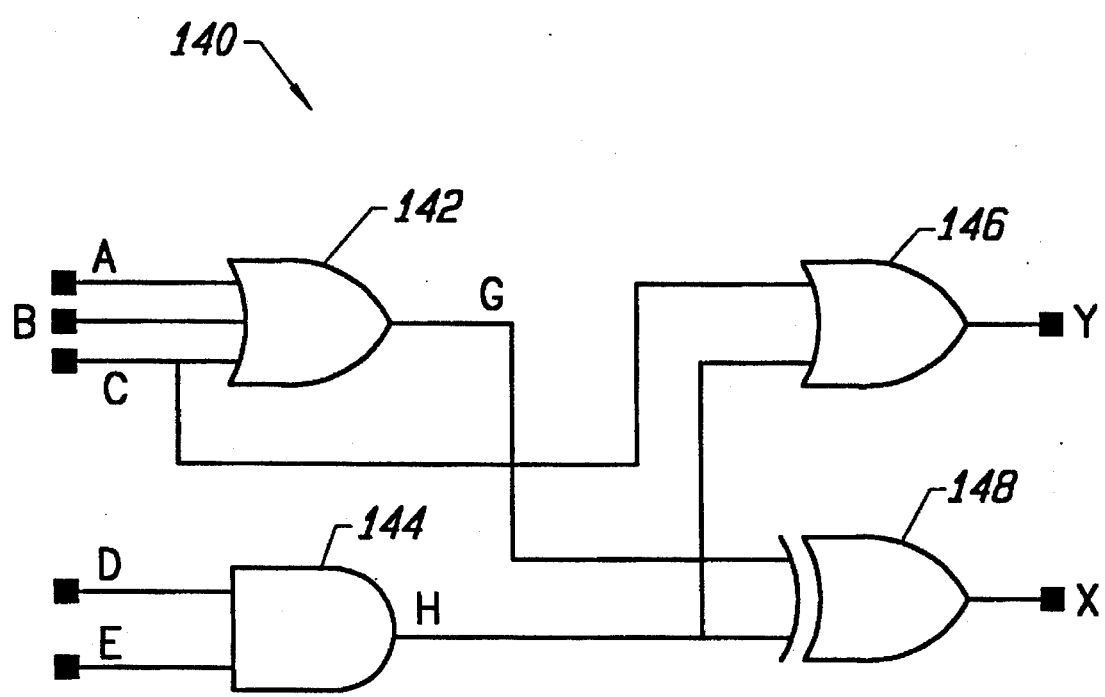
FIG. 8 is a schematic of a circuit which, by way of exhibiting the invention, is implemented in the FPLD of the invention.

The invention has now been fully described. However, to more fully appreciate the invention, attention is directed to a number of examples. FIG. 8 is a gate level schematic of an example circuit 140 which will be implemented in accordance with the invention. Three inputs to the circuit ("a", "b","c") are conveyed to an OR gate 142 to generate a "G" output Two inputs ("d", "e") are conveyed to an AND gate 144 to generate an "H" output. OR gate 146 receives the "c" input and the "H" input. XOR (Exclusive-Or) gate 148 receives the "G" input and the "H" input. The circuit 140 may be characterized by the following boolean statements:

$$G = a + b + c \quad (1)$$

$$H = d * e \quad (2)$$

$$x = G * \bar{H} + \bar{G} + H \quad (3)$$

$$y = c + H \quad (4)$$

FIG. 8 constitutes a "circuit description" corresponding to step 70 of FIG. 5. Equations (1) through (4) provide an alternate (but equivalent) "circuit description". Based on the implementation of block 70 of FIG. 5, a particular form of "circuit description" must be supplied. For the purposes of this illustrative example, a schematic or equation format will suffice.

FIG. 5 indicates that after a circuit description is received (block 70), the next step associated with implementing a circuit into the FPLD of the invention is to identify logic levels (block 72). In the case of the circuit of FIG. 8, there are two logic levels. At the first level is an OR gate 142 and an AND gate 144. At the second level is an OR gate 146 and a XOR gate 148. The next step associated with the processing of FIG. 5 is to create a logic table for each logic level (block 74). FIG. 9 depicts logic tables corresponding to the circuit of FIG. 8. At the first level, a logic table is provided for the "G" output and the "H" output. In reference to the logic table for the "G" output, note that there are eight addressable values ($2^3$), corresponding to the three input values ("a", "b", "c"). The logic associated with the various input values is provided in column "G". That is, for the OR gate 142, the output will be "1" unless all input values are zero. The logic table for the "H" output only has two input values. Therefore, the most significant input bit may be viewed as a "don't care" condition. Consequently, the logic for the first four values is the same as the logic for the next four values. In any event, the "H" output for the AND gate 144 will be "1" only when "d" and "e" are "1".

The second level of FIG. 9 includes logic tables for the "x" output and the "y" output. The logic table for the "x" output describes the logic for the XOR gate 148, while the logic table for the "y" output describes the logic for the OR gate 146. Note once again that each table only has two inputs so there is a "don't care" condition, resulting in a repeated output pattern.

In accordance with step 76 of FIG. 5, PI/Buffer controller logic may now be generated. In this example, at the first level of the circuit, the PI/Buffer select controller 56 would generate select signals so that all input values ("a", "b", "c", "d", "e") from input latch 32 are passed through multiplexer 54. At the second level of logic, a select signal would be generated to allow the buffered value "c" to pass through the multiplexer 54.

The B-Cross controller logic associated with step 78 of FIG. 5 may also be derived at this juncture. In this example, the B-Cross Dynamic Configuration Controller must provide logic to route the value "c" received at the first logic level. No operation is required at the second logic level.

The L-Cross controller logic associated with step 80 of FIG. 5 may be defined as follows. At the first logic level, the L-Cross Bar Dynamic configuration controller 42 must route input values "a", "b", "c", "d", and "e". These values are subsequently latched into the dynamic logic core 22. At the second logic level, input values "G", "H", and "c" are stored.

After the foregoing logic is downloaded in accordance with step 82 of FIG. 5, execution of the apparatus of the invention may commence, as characterized in FIG. 7.

FIGS. 10 through 13 demonstrate the architecture and operation of the invention in relation to the foregoing example. These figures will be described in the context of the processing steps described in FIG. 7.

Figure 10:
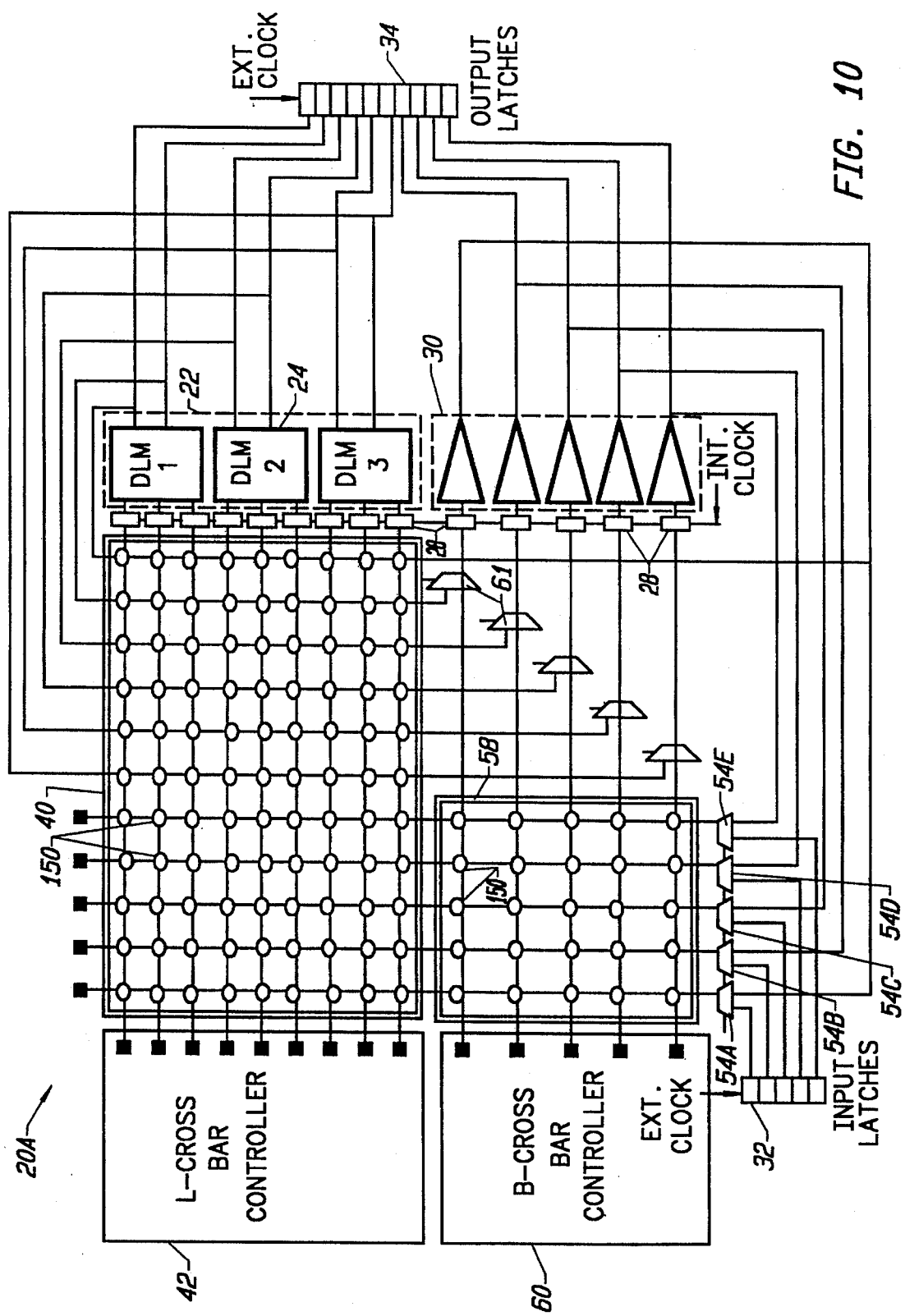
FIGS. 10–13 depict the implementation of the circuit of FIG. 8 into an FPLD of the invention.

FIG. 10 depicts a FPLD 20A which may be used to implement the circuit of FIG. 8. The apparatus 20A generally corresponds with the apparatus of FIG. 2. Note that the L-Cross bar 40 and the B-Cross bar 58 are depicted as a grid of crosspoints 150. FIG. 10 does not depict a PI/Buffer Select Controller 56. The remaining figures will not depict the L-Cross bar controller 42 or the B-Cross bar controller 60.

Figure 11:
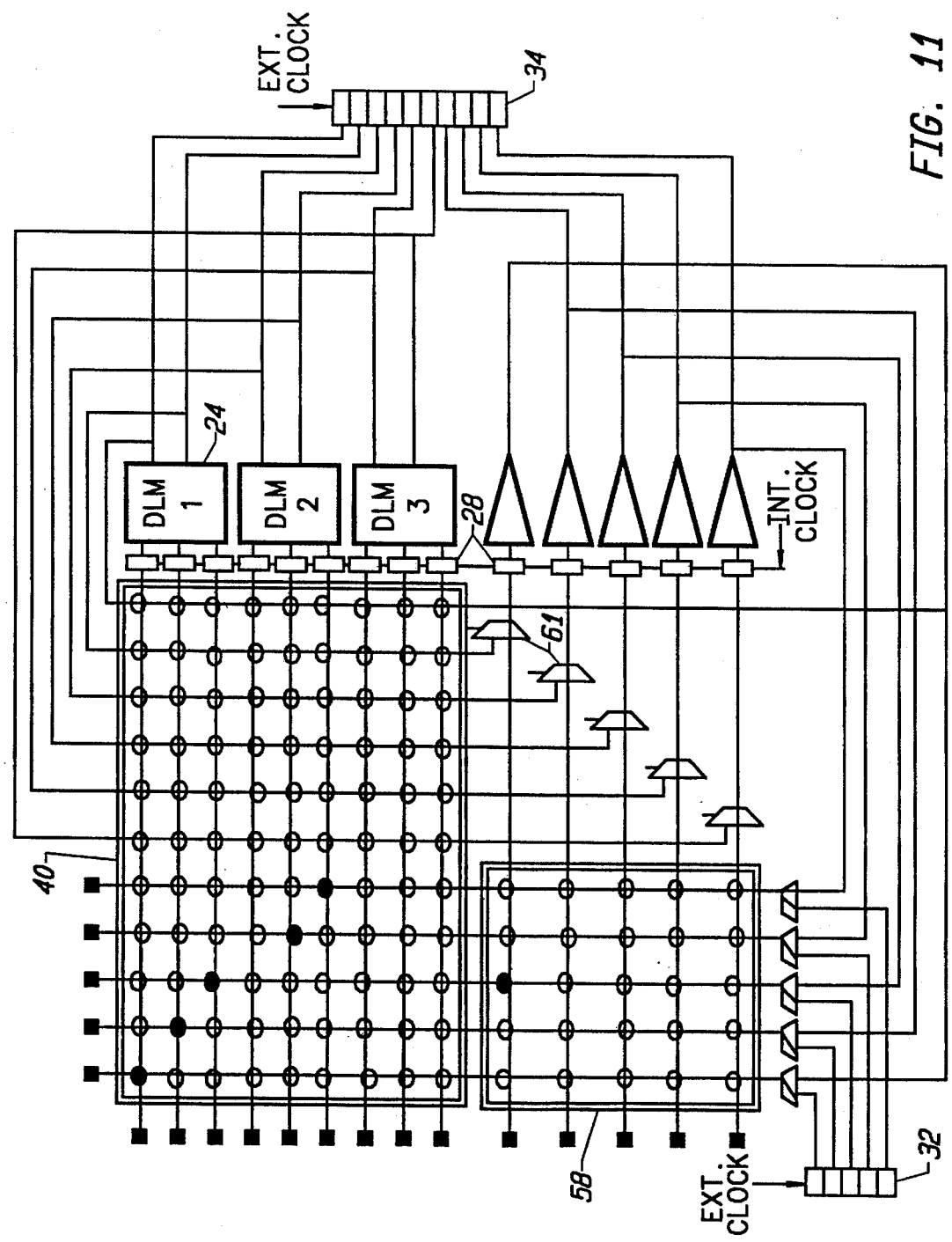

FIG. 11 depicts the results after the performance of steps 120, 122, and 124 of FIG. 7. Recall that some of these steps may be performed in parallel. However, for the purpose of clearly illustrating the invention, the steps will frequently be described as being performed in a sequential manner.

The figure depicts that input values "a", "b", "c", "d", and "e" are latched into input latch 32 (step 120 of FIG. 7). The figure also depicts, with a dark circle, that a buffer value "c" is routed through the B-Cross bar 58 (step 122 of FIG. 7). The figure also depicts that input values "a", "b", "c", "d" and "e" are routed through L-Cross kar 40 (step 124 of FIG. 7).

Figure 12:
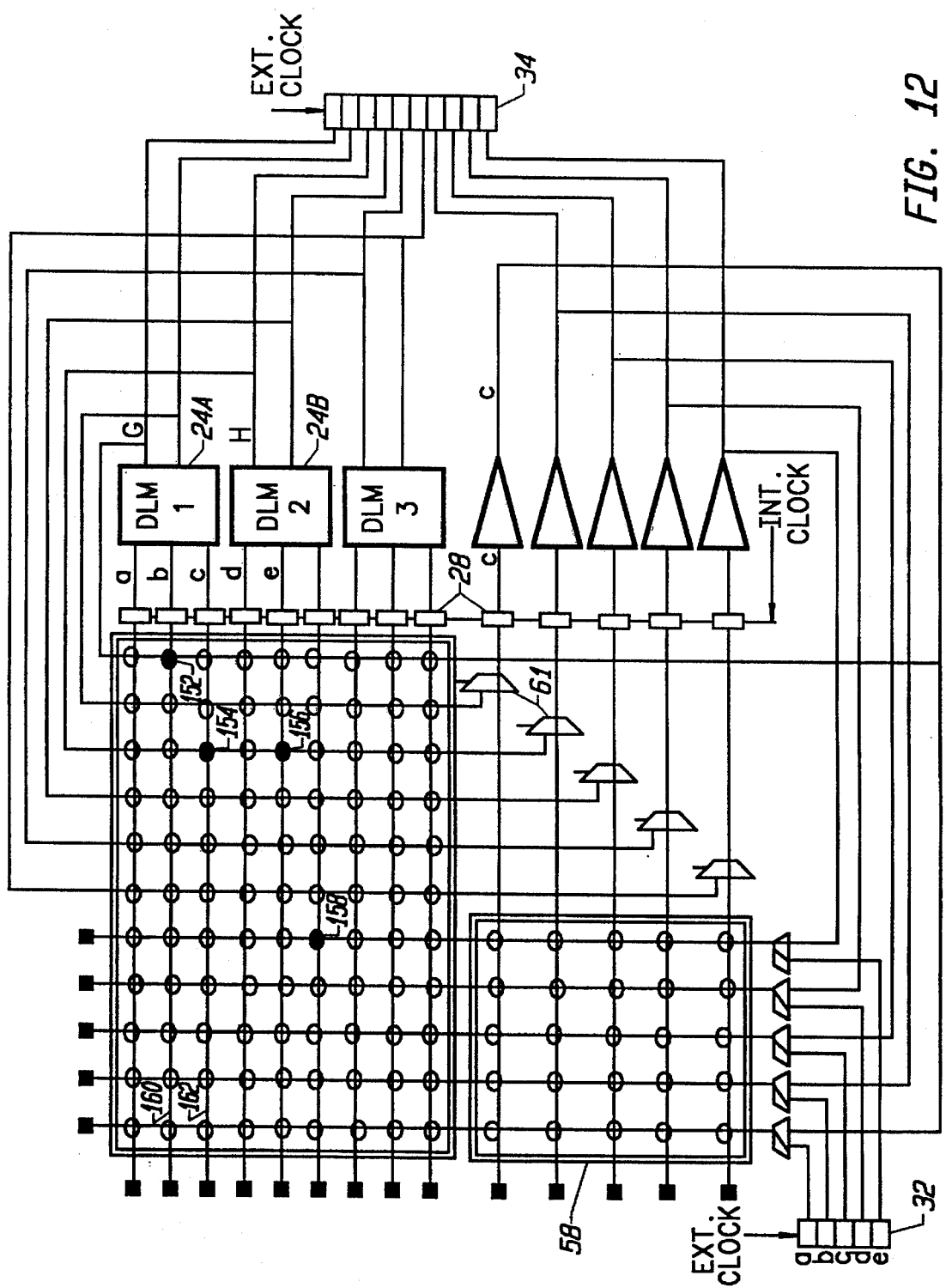

FIG. 12 depicts the results after the performance of steps 126, 128, 130, and 120 of FIG. 7. The figure depicts that the values from the L-Cross bar 40 and the B-Cross bar 58 were loaded into latches 28. Thereafter, the L-Cross bar values were conveyed to dynamic logic modules 24A and 24B, corresponding to the "G" logic table and the "H" logic table of level 1. Dynamic logic module 24A yielded value G and dynamic logic module 24B yielded value H (Step 126 of FIG. 7). Concurrent with the execution of this logic, the counter 44 (of FIG. 3, not shown in FIG. 12) increments the logic level (block 128 in FIG. 7). In this example, only the first logic level has been processed, therefore one more logic level must be processed.

Since the second logic level is the final logic level, buffer values do not have to be routed (block 122 in FIG. 7). On the other hand, logic values must be routed through the L-Cross bar 40 (block 124 in FIG. 7). Note that in FIG. 12, the "G" output is directly routed from the dynamic logic module 24A through the L-Cross bar at crosspoint 152. Similarly, the "H" output is directly routed from the dynamic logic module 24B through the L-Cross bar at crosspoints 154 and 156. Finally, the buffered value "c" is routed through the L-Cross bar at crosspoint 158.

The L-Cross bar controller 42 enables "writes" to these locations. In defining the L-Cross controller logic (block 80 in FIG. 5), it is known, for instance, that at the second logic level, inputs "G" and "H" are required for the "x" logic table which is implemented by dynamic logic module 24A. Therefore, two inputs to the dynamic logic module 24A are enabled to receive the "G" and "H" values. More particularly, rows 160 and 162 are enabled so as to receive data from the output of the dynamic logic modules 24. Implementation options for the cross bar structures of the invention are discussed below.

Figure 13:
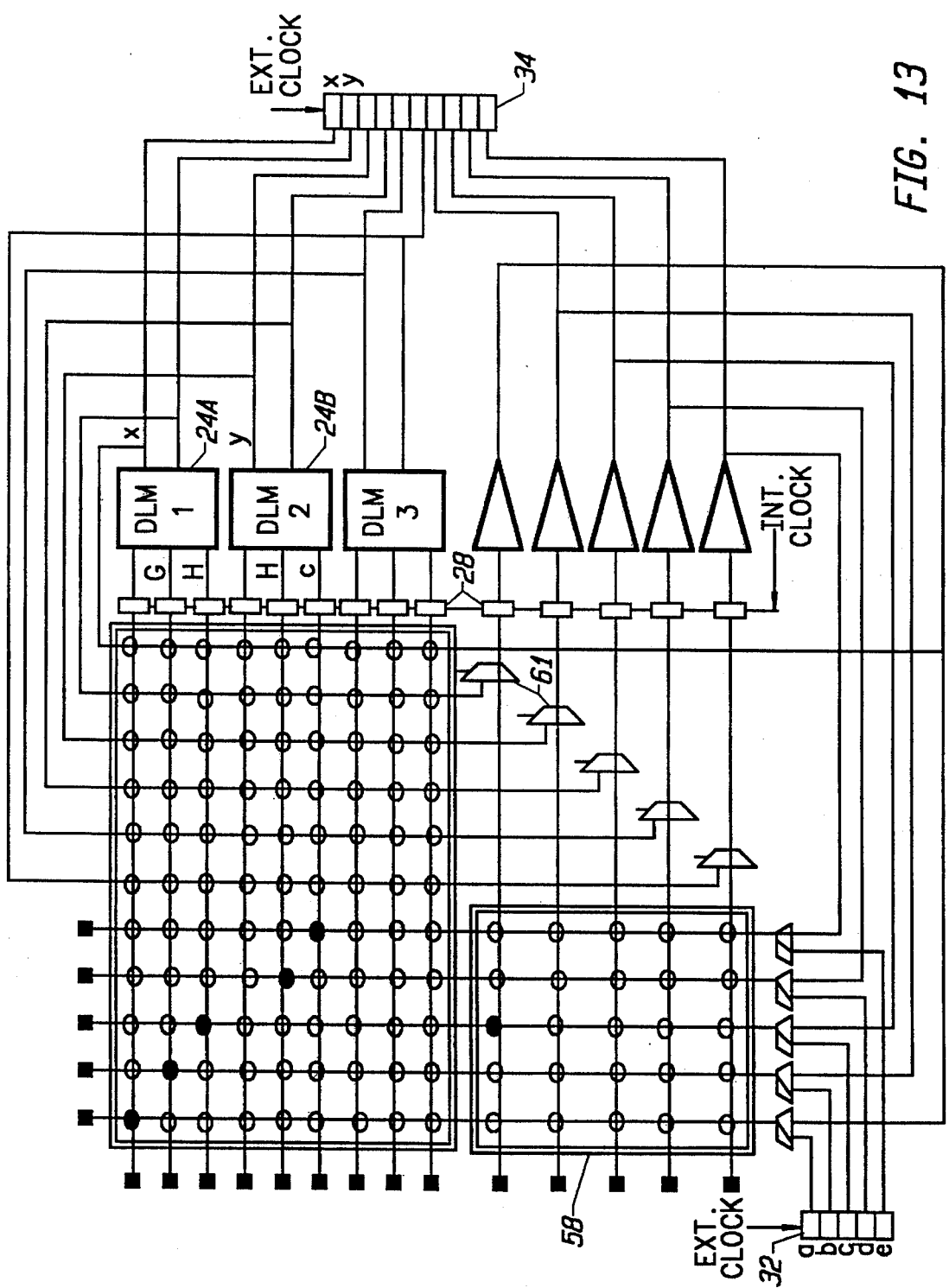

FIG. 13 depicts the processing associated with steps 125, 128 and 130 of FIG. 7. FIG. 13 shows that the second level input values "G" and "H" are latched in latches 28. These values are then conveyed to logic table "x" which is implemented by dynamic logic module 24A. Second level input values "H" and "c" are similarly latched into logic table "y" which is implemented by dynamic logic module 24B.

The logic modules then execute their respective logic (step 126 in FIG. 7) and the counter (not shown) is incremented (step 128 in FIG. 7). Since the second level has been processed, the "x" and "y" output values are conveyed to output latch 34.

The apparatus 20A may now process another set of input values (step 120 in FIG. 7). FIG. 13 depicts a new set of input values at input latch 32. Processing of these values proceeds in the manner previously described.

Figure 14:
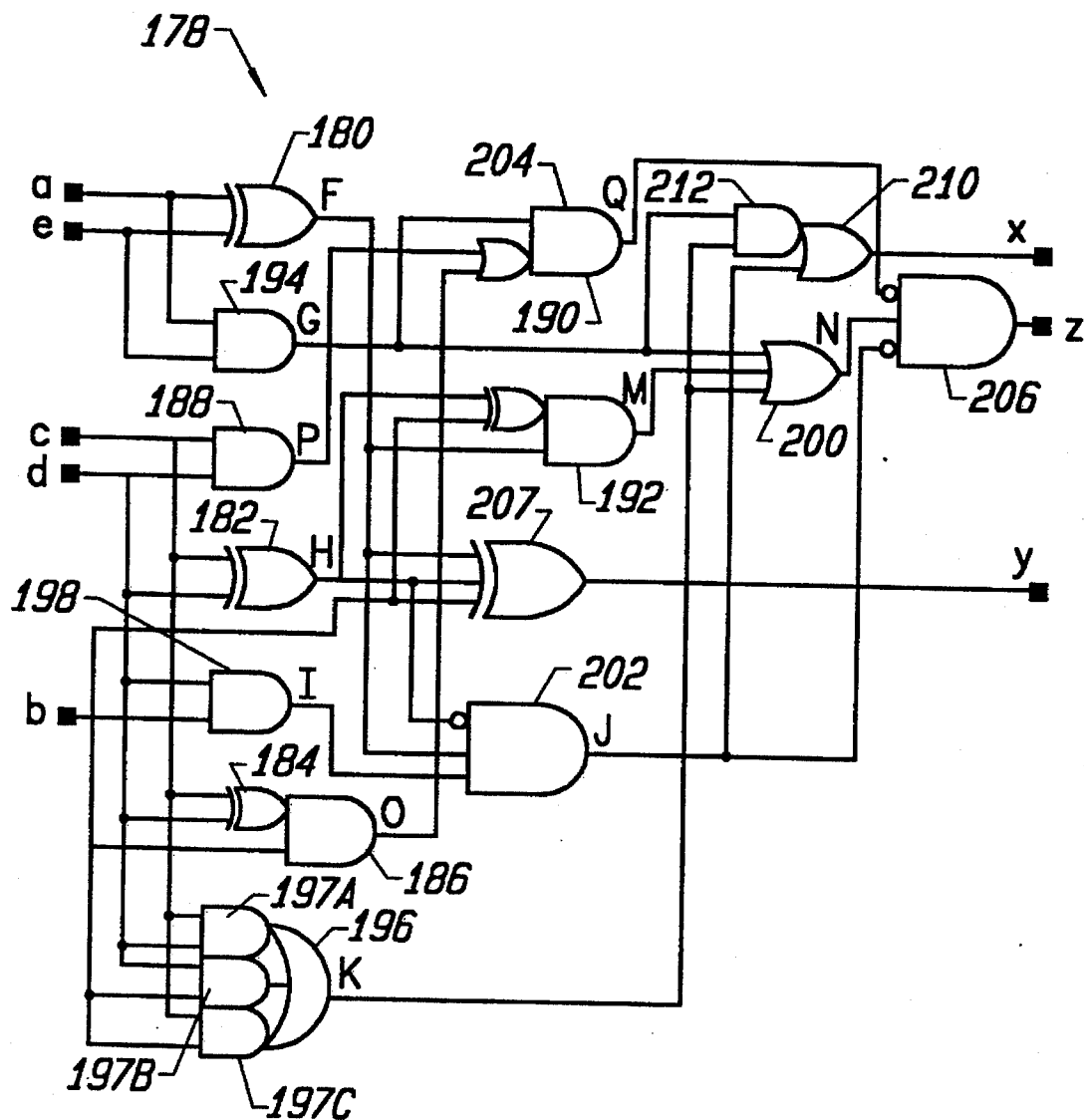
FIG. 14 is a schematic of a circuit which, by way of exhibiting the invention, is implemented in the FPLD of the invention.

FIG. 14 depicts another circuit 178 which may be implemented in accordance with the invention. Analysis of the circuit 178 reveals that there are four logic levels. The first logic level processes the input signals and does not rely upon output from another level. The first logic level includes XOR gates 180, 182, 184, AND gate 186, and AND gate 188. The second logic level processes the input signals and signals generated at the first logic level. The gates at the second logic level include XOR gate 190, AND gate 192, AND gate 194, OR gate 196 (which is coupled to three AND gates 197A, 197B, 197C), and AND gate 198. The third logic level processes the signals generated at the first logic level and the second logic level; it may also process the input signals, but it does not in this case. The third logic level in this example includes OR gate 200. AND gate 202, and AND gate 204 (which is coupled to OR gate 205). The fourth logic level, the last logic level in this example, produces the output values. The fourth logic level includes AND gate 206, XOR gate 208, and OR gate 210 (which is coupled to AND gate 212). For more complex circuits, Directed Acyclic Graphs, known to those skilled in the art, may be used to simplify the levelization process.

Figure 15:
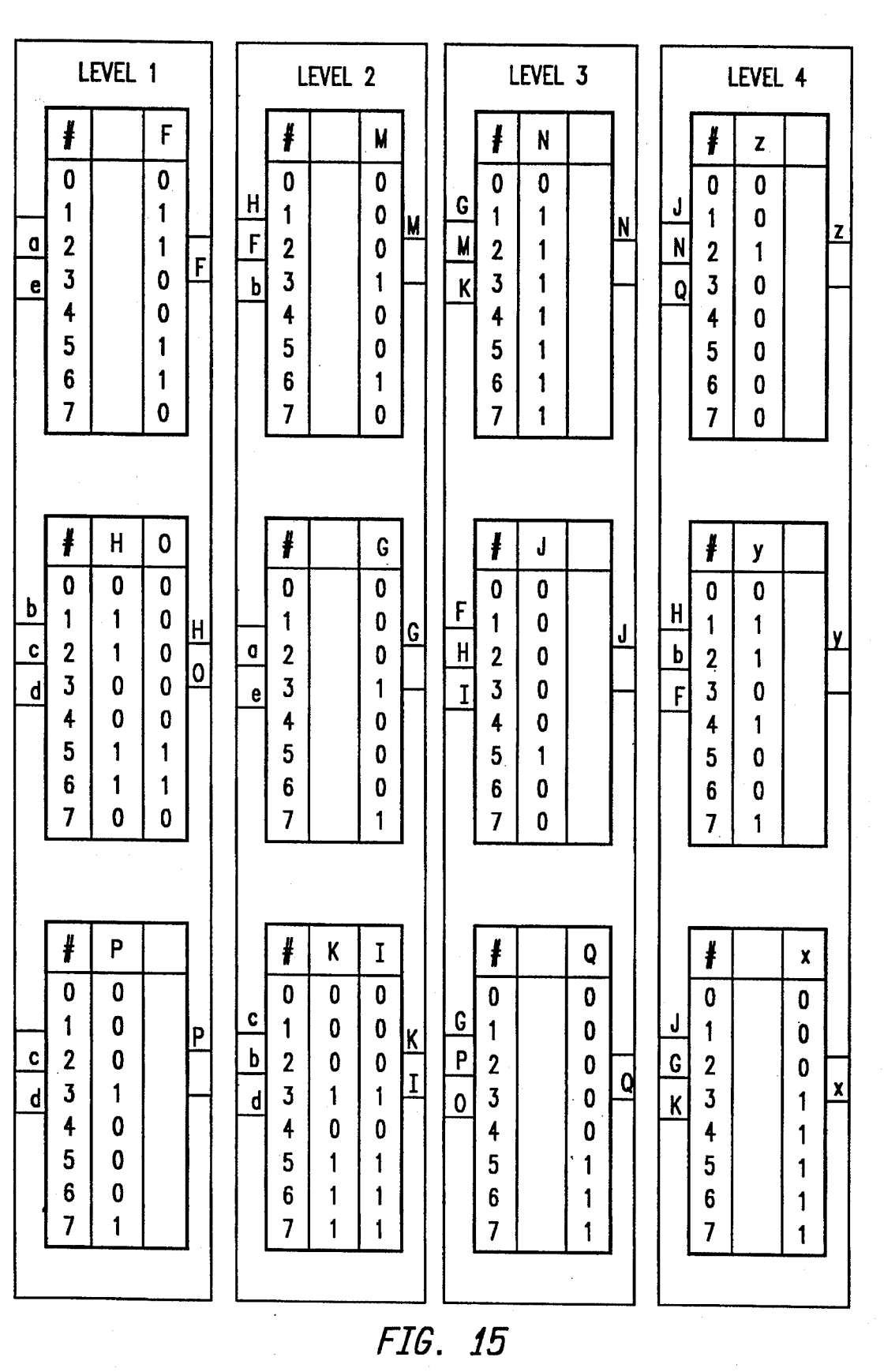

Thus, FIG. 14 represents a circuit description (step 70 of FIG. 5). The foregoing paragraph identifies the logic levels associated with the circuit (step 72 of FIG. 5). FIG. 15 depicts logic tables for each level (step 74 of FIG. 5). Note that table "HO" at level 1 produces two output values. Output value "O" requires three inputs "b", "c", and "d" (going to XOR gate 184 and AND gate 186). On the other hand, value "H" requires only two inputs "c" and "d", thus a "don't care" state exists for the input value "b". Combinations of this type may be made to form efficient dynamic logic modules 24. Table "KI" in level 2 is another example of an instance in which resources can be shared.

The next processing steps associated with designing an FPLD in accordance with the invention relate to generating the appropriate logic for the various controllers. For the present example, the PI/Buffer controller 56 needs to select all the input values at the first logic level. At the second logic level, the PI/Buffer controller 56 will allow all of the initial input values to pass through the multiplexer(s) 54 for further processing. At the third logic level, the PI/Buffer controller 56 will allow the intermediate signals "F", "H", "O", and the input signal "b" to pass through. At the fourth logic level, the PI/Buffer controller 56 will allow the final stage input values "H", "B", "F", "G", and "K" to pass through for processing.

The B-Cross Bar Dynamic Configuration Controller 60 will utilize four stages of logic to implement the circuit of FIG. 14. At the first level of logic the B-Cross controller 60 will enable the B-Cross bar to route all of the input values because they will all be need for subsequent processing. At the second logic level, the B-Cross controller 60 will enable the B-Cross bar to route only the "b" value, which will be needed at the fourth logic level. At the third logic level, the B-Cross controller 60 will enable the B-Cross bar to route the values "F", "H", and "b", which are required for fourth logic level processing. At the final logic level, the B-Cross controller 60 does not have to initiate any routing control.

The L-Cross Bar Dynamic Configuration Controller 42 logic must enable the appropriate input, at various logic levels, for the dynamic logic modules 24. At the first logic level, the L-Cross controller 42 enables the L-Cross Bar 40 to route values "a" and "e" for dynamic logic module 24A; "b", "c", and "d" for dynamic logic module 24B; and "c" and "d" for dynamic logic module 24C. At the second logic level, the L-Cross controller 42 enables the L-Cross Bar 40 to route values "H", "F" and "b" for dynamic logic module 24A; "a" and "e" for dynamic logic module 24B; and "c", "b", and "d" for dynamic logic module 24C. At the third logic level, the L-Cross controller 42 enables the L-Cross Bar 40 to route values "G", "M" and "K" for dynamic logic module 24A; "F", "H" and "I" for dynamic logic module 24B; and "G", "P", and "O" for dynamic logic module 24C. At the fourth logic level, the L-Cross controller 42 enables the L-Cross Bar 40 to route values "J", "N" and "Q" for dynamic logic module 24A; "H", "F" and "b" for dynamic logic module 24B; and "G", "J", and "K" for dynamic logic module 24C.

Returning to FIG. 5, appropriate logic for the logic tables, PI/Buffer Controller, B-Cross Controller, and L-Cross Controller has now been described. This logic may now be downloaded to non-volatile memory (block 82).

Figure 16:
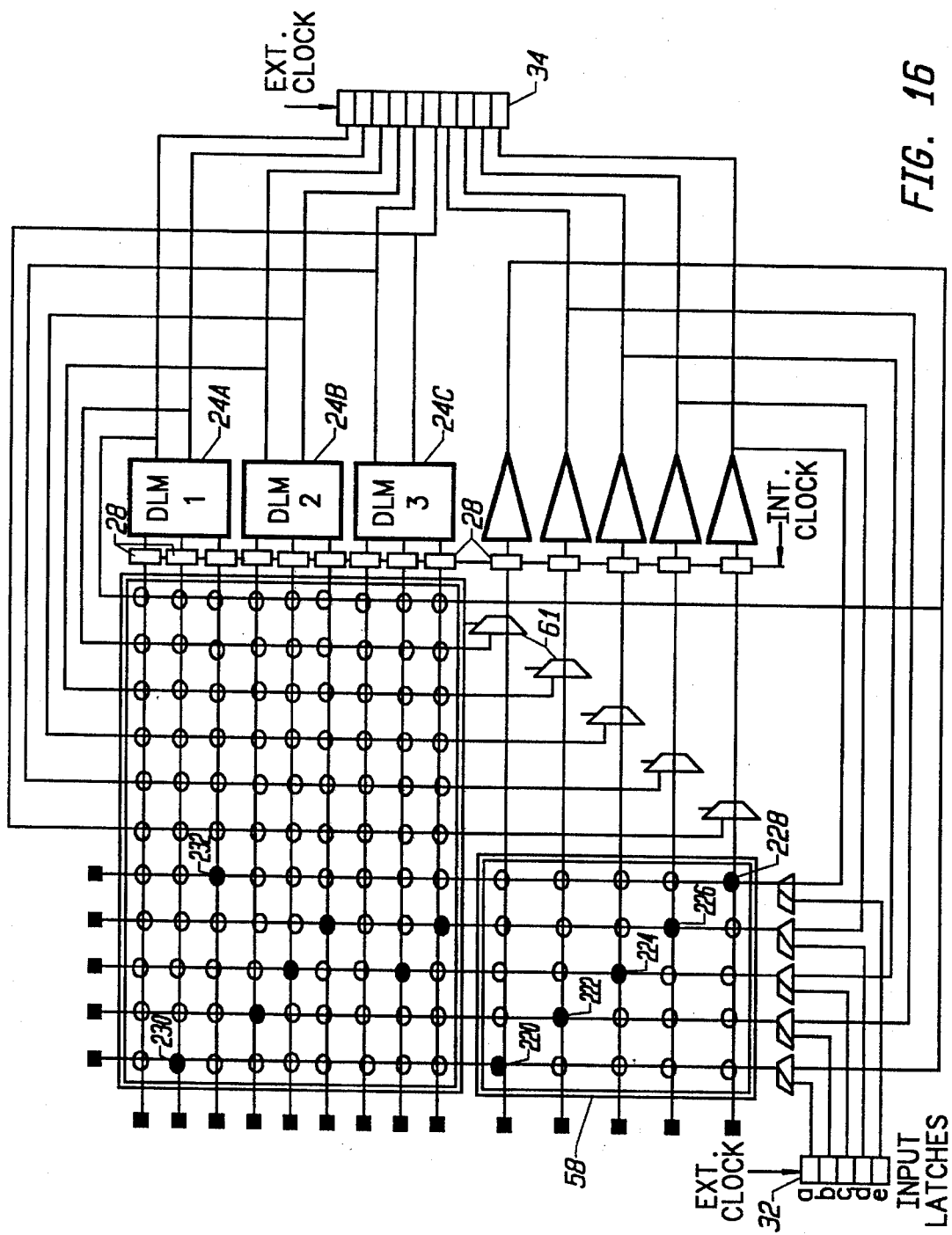
FIGS. 16–20 depict the implementation of the circuit of FIG. 14 into an FPLD of the invention.

The processing of input signals associated with the circuit of FIG. 14 will now be described with reference to FIG. 7 and FIGS. 16 through 20. FIG. 16 depicts processing steps 120, 122 and 124 of FIG. 7. In particular, the figure depicts that input values are fed to an input latch 32 (block 120 of FIG. 7). The FIG. also shows that buffer values are routed through the B-Cross bar 58 at crosspoints 220 through 228 (block 122 of FIG. 7). FIG. 16 also depicts the logic values routed through the L-Cross bar 40. For instance, note that crosspoint 230 routes value "a" and crosspoint 232 routes value "e". Each of these values is subsequently conveyed to a latch 28 and is then executed by dynamic logic module 24A.

Figure 17:
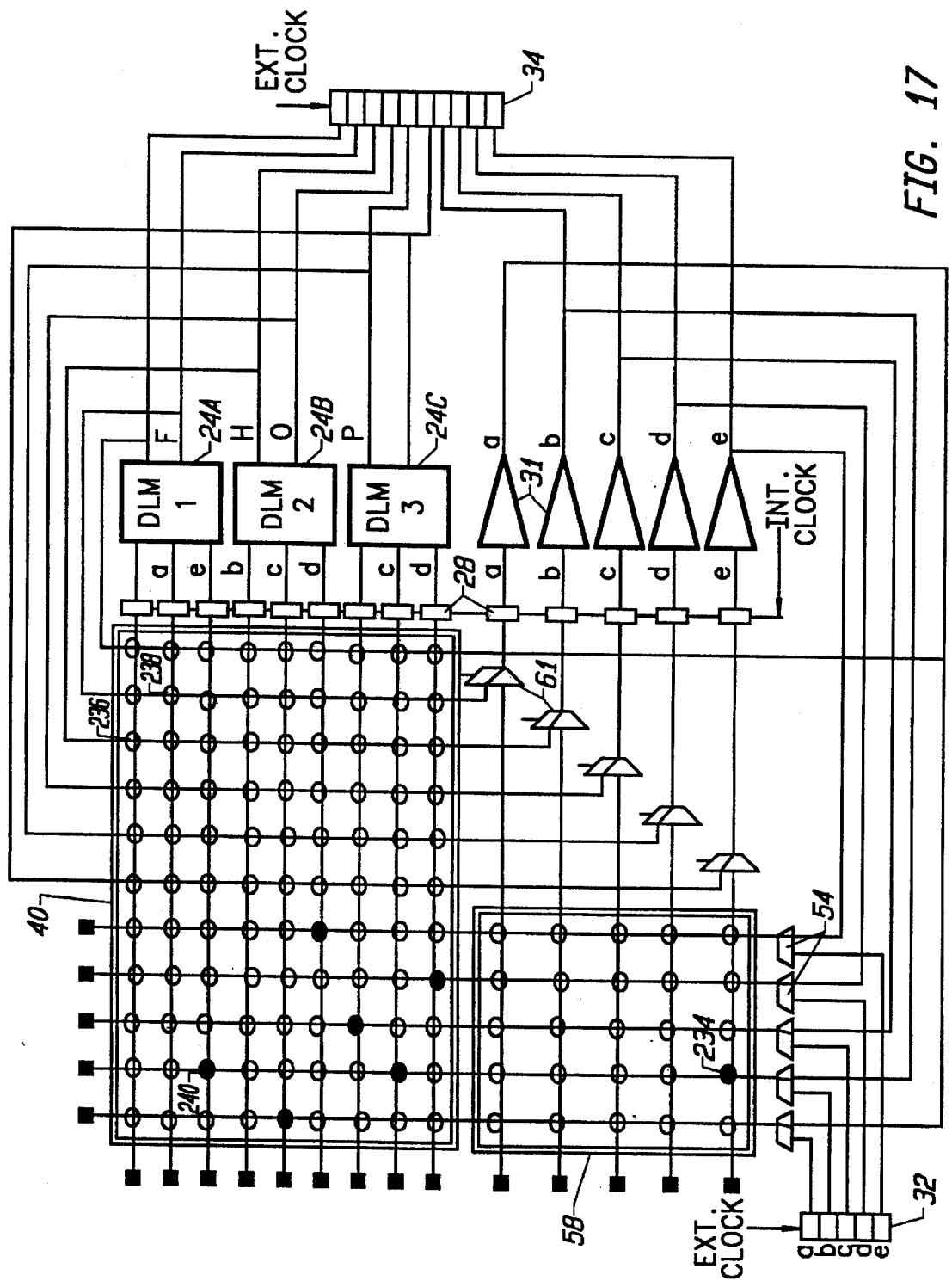

FIG. 17 depicts, in a sequential manner, processing steps 126, 120, 122, and 124 associated with FIG. 7 (recall that several of these steps may be performed in parallel). The figure depicts latches 28 loading the dynamic logic modules 24 for logic execution (step 126 in FIG. 7). The figure also depicts latches 28 loading buffers 31. As shown in FIG. 7, the next processing steps are to increment the logic level (block 128) and to query whether all levels have been processed (decision block 130). The logic level is not shown being incremented in FIG. 17, but circuitry disclosed for this purpose was disclosed in FIG. 3. Since all logic levels have not been processed at this juncture, new input is obtained (block 120 of FIG. 7). Thus, at this point, as previously stated, the PI/Buffer Controller 56 would allow all of the buffered values to pass through multiplexers 54. Then, appropriate buffer values would be loaded in the B-Cross Bar 58 (block 122 of FIG. 7). FIG. 17 depicts that at crosspoint 234 the value "b" is routed, which is the only value at this processing juncture which must be subsequently utilized.

Finally, FIG. 17 depicts loaded logic values for the second logic level (block 124 of FIG. 7). For example, note that at crosspoint 236 the output value "F" is loaded into the L-Cross bar 40. This value was obtained directly from the dynamic logic module 24A. The crosspoint 238 routes the output value "H", which was also received directly from the dynamic logic module 24A. The crosspoint 238 routes the value "b", which was a previously buffered value.

Figure 18:
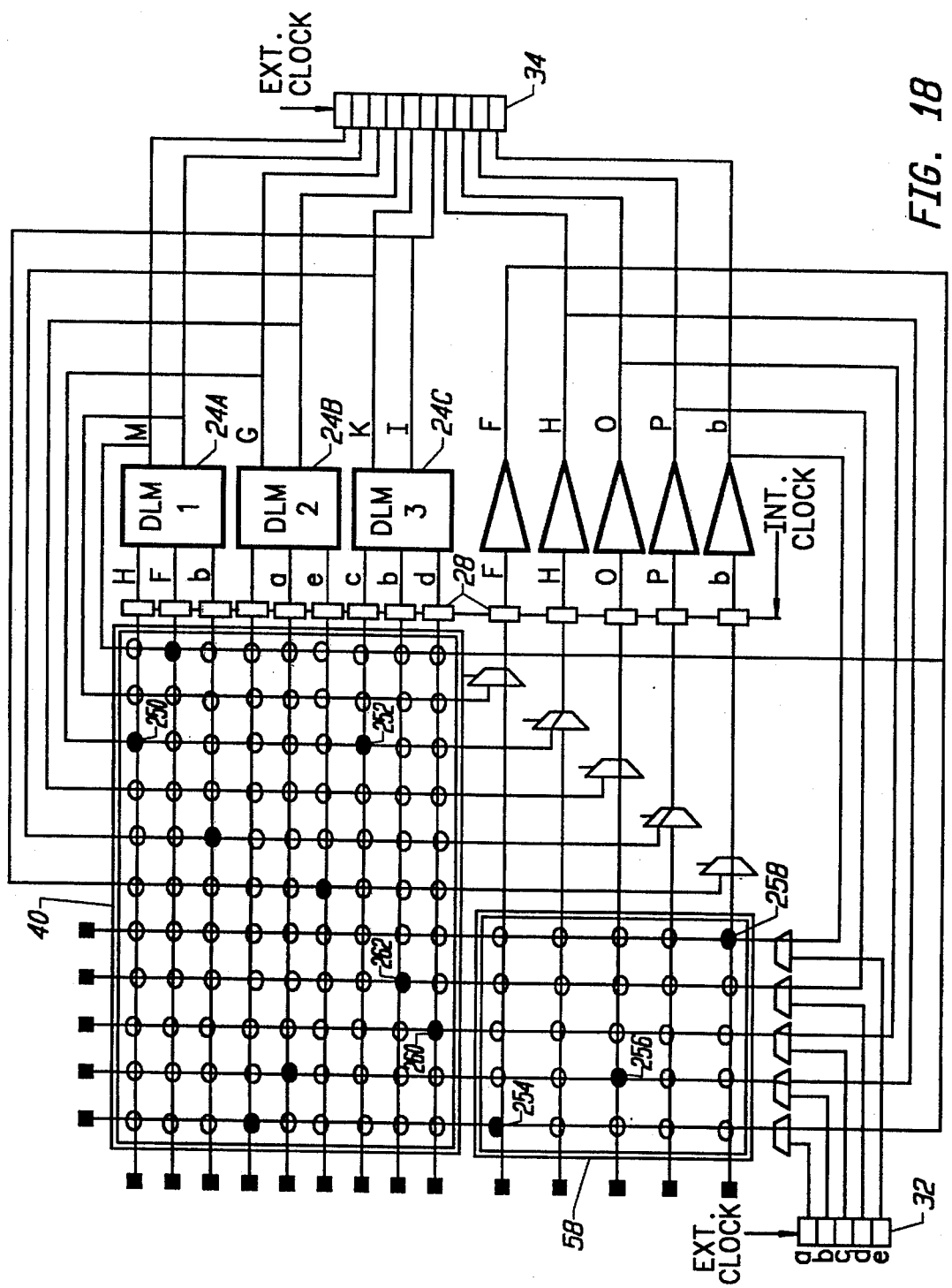

FIG. 18 depicts the continued processing associated with the circuit of FIG. 14. The Figure depicts the second level logic values loaded into latches 28. The figure also depicts the outputs from the execution of the logic. The figure also shows how these outputs are reprocessed in accordance with the invention. For example, note that output "G" is conveyed through crosspoints 250 and 252 so that they may subsequently serve as inputs to dynamic logic modules 24A and 24C during execution of the third logic level. FIG. 18 also depicts that values "F", "O", and "B" are routed at crosspoints 254, 256, and 258 in B-Cross bar 58 for subsequent processing (values "F" and "O" are used at logic level 3 and value "b" is used at logic level 4). Finally, FIG. 18 depicts that previously buffered values are routed through the L-Cross bar 40. For example, crosspoint 260 routes the previously buffered value "O" and crosspoint 262 routes the previously buffered value "P". Both of these values serve as inputs to dynamic logic module 24C during logic level 3.

Figure 19:
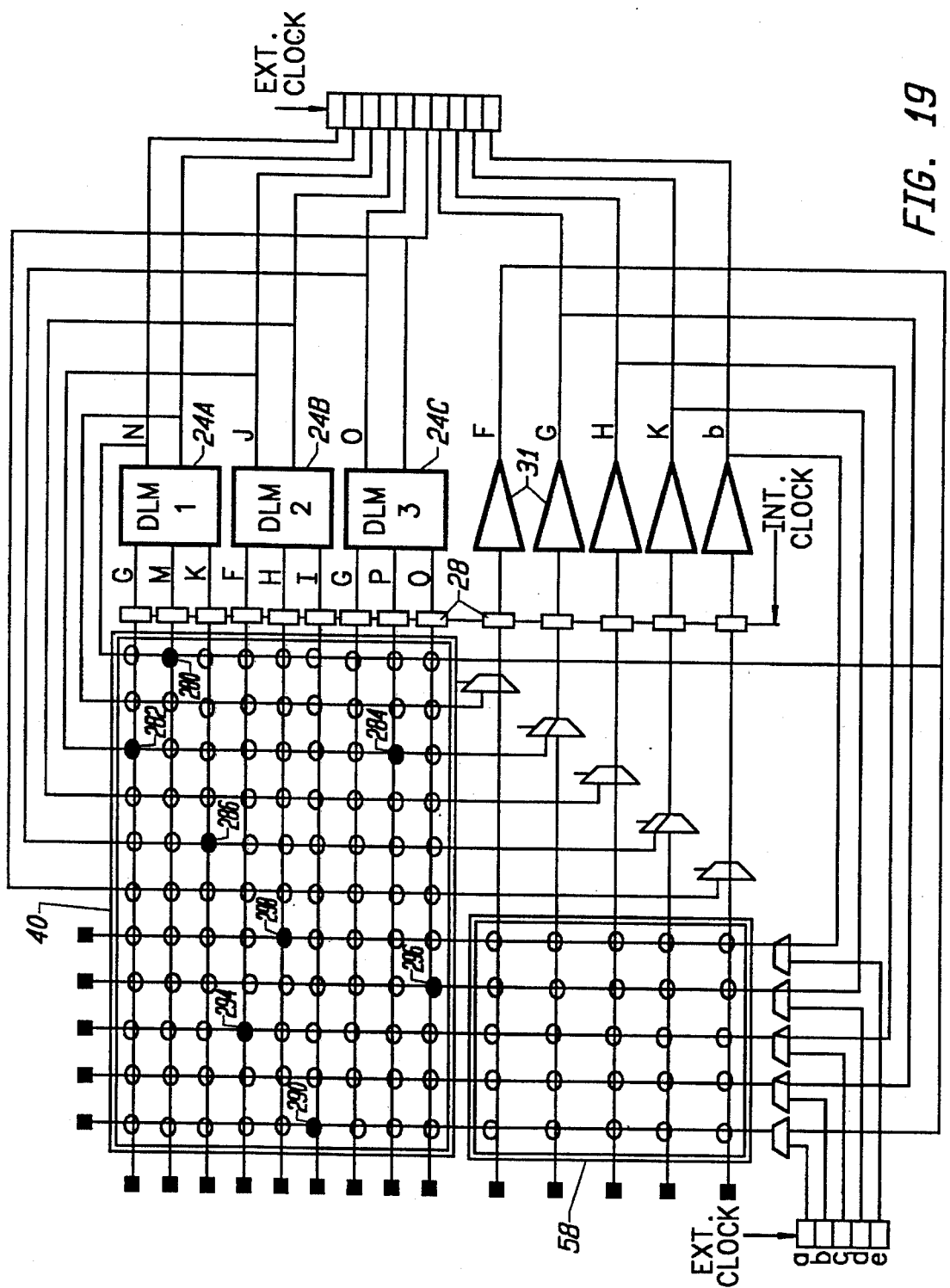

FIG. 19 depicts the third logic level processing associated with the invention. The third logic level input values are shown as being in latches 28. The third logic level output values are shown as output signals of the dynamic logic modules 24. The figure depicts the logic values "N", "J" and "Q" having been conveyed through the L-Cross bar 40. Logic value "N" is conveyed through crosspoint 280, logic value "J" is conveyed through crosspoints 282 and 284, and logic value "Q" is conveyed through crosspoint 286. The remaining values in the L-Cross bar 40 were obtained from buffers 31. Buffer value "F" is conveyed through crossbar 290, value "G" is conveyed through crossbar 292, value "H" is conveyed through crossbar 294, value "K" is conveyed through crossbar 296, and value "b" is conveyed through crosscrossbar 298. Note that there are no values in the B-Cross bar 58 because the final logic level is about to be executed.

Figure 20:
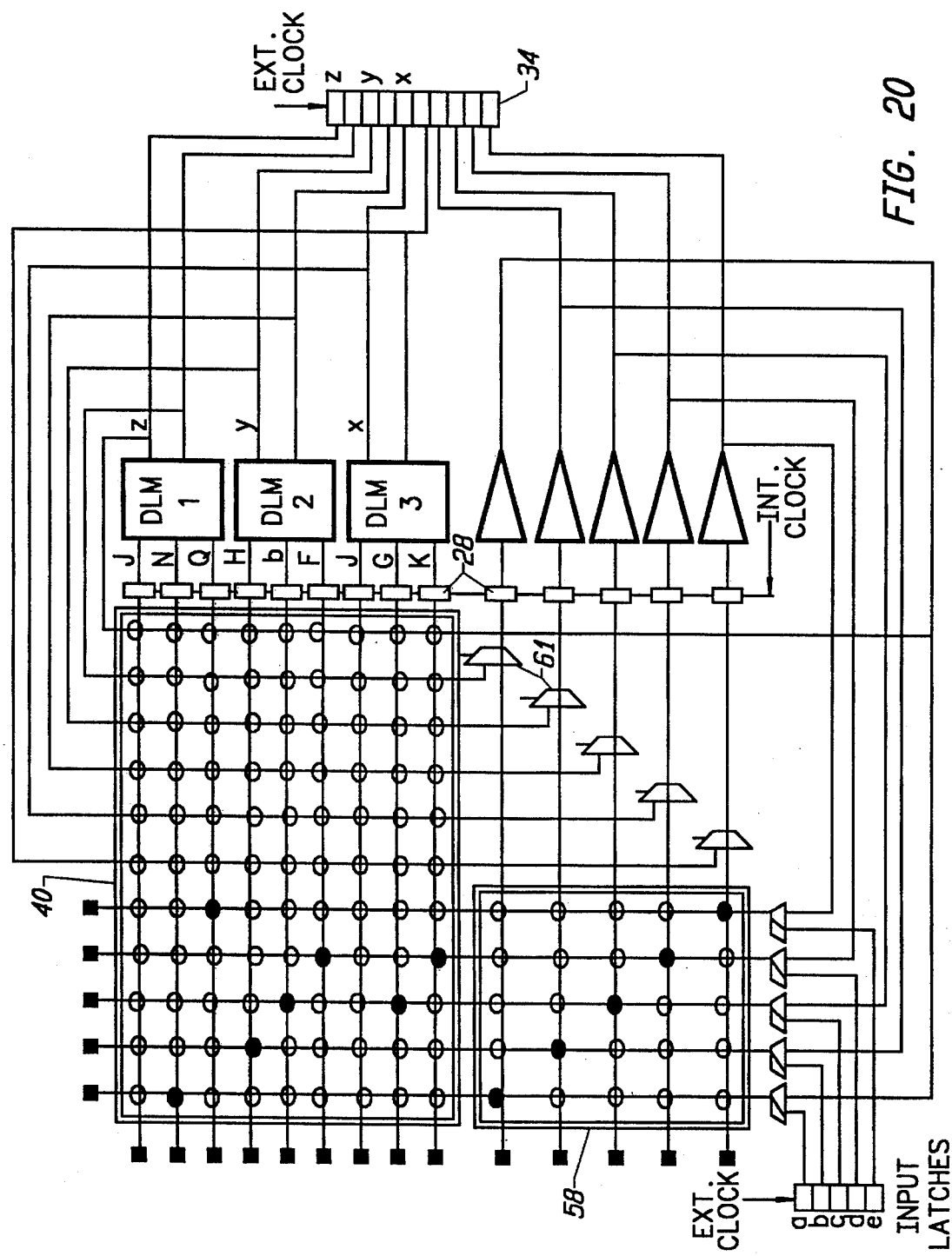

Turning now to FIG. 20, the fourth level logic inputs are shown in latches 28. FIG. 20 also shows dynamic logic module outputs "x", "y", and "z". Since this is the last logic level, the values are conveyed to the output latch 34. The figure also depicts the next stage of input entering the circuit 20B. This configuration is the same as that of FIG. 16, which has been previously discussed.

Attention now turns to some implementation considerations. Assume that a given FPLD has L levels and C dynamic logic modules 24, each having m outputs. Assume that the logic network being implemented is a feasible network (i.e., each node in the network has $\leq K$ inputs and $C \leq m$ outputs). If not, known logic synthesis techniques can be used to transform it into one. Let the combinational part of the feasible network be topologically levelized. Let $\rho$ be the number of levels, and $\Gamma$ be the maximum number of modules in any level for the circuit. If $\rho \leq L$ and $\Gamma \leq C$, (e.g. FIG. 9, $\rho=2$, $\Gamma=2$, $L=4$, $C=3$; FIG. 15, $\rho=4$, $\Gamma=3$, $L=4$, $C=3$) then the mapping is straightforward, with one level of the circuit being evaluated in every internal cycle. If $\rho>L$ or $\Gamma>C$, then it may be possible to implement the circuit by grouping together modules across several levels. Each group can then be realized in more than one internal cycle, before switching over to the next group.

When a design does not fit on a single chip, then the design must be split across several chips. If the partitions are independent (i.e., they do not share any common signals), then the split does not pose any problems.

Consider the case where there are $\rho$ ($\rho>L$) levels of combinational logic, with C modules per level. In this case, one requires $\rho/L$ chips, and a mechanism to synchronize their level counting circuitry. FIG. 3 shows two signals, "To Next Chip" and "From Previous Chip". These signals are connected in daisy chain fashion, so that chip $C_i$ connected after chip $C_{i-1}$ begins its level counter only after chip $C_{i-1}$ has reached its maximum level. If the design is such that $\Gamma>C$, then splitting across chips could necessitate duplication of logic.

As stated above, the dynamic logic module 24 may be any re-configurable logic structure which can be repetitively changed to implement different functions. Other possible logic module implementations include: (1) a K-input, m-output look-up table, where K and m are integers, (2) interconnection of many look-up tables, each with 1 or more outputs, and having either varying or same number of inputs, (3) multiplexer based logic modules, (4) two level AND-OR logic plane, and variations thereof, with the AND and OR inputs controlled by programmable read/write memory bits, and (5) heterogenous dynamic logic modules employing a combination of logic implementations.

The dynamic interconnection array 26 also has a large number of variations possible, both in terms of the overall architecture, and the actual implementation of the architecture. The following description details alternate implementations.

Each crosspoint of the crossbar may be implemented with a transistor. For example, the source of a transistor may be coupled to an output line from the buffer array 30 or from the logic core 22. The drain of the transistor may be coupled to an appropriate dynamic logic module 24. The L-Cross bar controller 42 or the B-Cross bar controller 60 may then be used to provide a gate signal when a signal is to be conveyed to a given dynamic logic module.

Another approach for implementing the cross bar structures of the invention is to use shift registers. Each crosspoint of the crossbar has L bits of memory, a bit being used per level. These bits could be arranged in the manner of a shift register so that the change of level would just mean shifting one bit. The disadvantage in such an implementation would be that the entire L bits will have to shift through before returning to the first level, and hence only circuits with l levels, where l is a perfect divisor of L can be implemented. A better design is to have L rows of memory, each row consisting of memory on all the crosspoints, and to choose the row in use by means of the level counter.

The cross bar structures may also be implemented using multiplexers. For example, a multiplexer would be used for each row of the crossbar. The inputs to the multiplexer would be the signals from the buffer array 30 and the signals from the dynamic logic core 22. The outputs from each multiplexer would be coupled to a dynamic logic module 22. The L-Cross controller 42 or B-Cross controller 60 would be used to generate appropriate select signals for each multiplexer.

Since there are (MC+B)KC crosspoints in the L-crossbar, (MC+B)KCL memory bits are required. However, each of the K-inputs of a logic module are identical, and it does not matter to which one a signal is assigned. In other words, the (MC+B) signals need to connect to only one of the K inputs per dynamic logic module 24. This means that the K bits can be reduced to $\log_2 K$ bits per signal, reducing the total bits to $\log_2 KCL(MC+B)$. However, this would warrant a decoder at each level. It is preferable to recognize that at each dynamic logic module 24 input a (MC+B)-to-K multiplexer is required, not a (MC+B)-to-K crossbar. A (MC+B)-to-1 multiplexer requires $\log_2(MC+B)$ select lines and K multiplexers. Each select line needs a bit per level, therefore one requires $KCL\log_2(MC+B)$ bits and $KC(MC+B)$-to-1 decoders. This would be more area efficient if $KCL\log_2(MC+B)+KC(MC+B)\delta<KCL(MC+B)$, where $\delta$ is the bit-equivalent of a decoder and gate. Since the dynamic logic modules 24 and interconnections both require decoders, there could be a sharing of decoders. This would require that extra latches be placed at the dynamic logic module outputs.

A further decrease in the number of crosspoints can be achieved through hardwired connections. Each dynamic logic module can have a hard-wired connection to K dynamic logic modules, and each dynamic logic modules will have inputs coming from K dynamic logic modules, preferably those that are adjacent to it. This would imply that the crossbar (or multiplexer, as the case may be) would then be reduced to a (MC−K+B)KC crosspoints, and there would be KC additional 2-input multiplexers (one at each input), with associated KCL select bits. This interconnection scheme would decrease the number of fanout points from the dynamic logic module output to (MC−K)K+K, instead of the earlier KC.

A different type of interconnection strategy can be adopted by recognizing that all dynamic logic module inputs are equivalent. Hence, the interconnection switch at the inputs is, by circuit switching terminology, a (MC+B)-to-K concentrator. In other words, one must select any K of the (MC+B) signals. This can be achieved by using a two-level sparsely connected crossbar, known in the art as a binomial concentrator. The chief advantage of using such an interconnection strategy is that all the number or crosspoints are reduced and as a result the number of bits used for storage are reduced. The disadvantage is that the signals now have to pass through two crosspoints in series. This could increase the interconnect delay.

An alternate way is to treat the routing as a "copy" function. For example, consider one DLM input. It can be connected to any one of the (MC+B) signals coming from the previous level. That is, its value should be set to the value of one of the (MC+B) signals. This is equivalent to a memory read operation, where the memory consists of (MC+B) bits, and one of them has to be read onto the switch output. Therefore, the selection can be performed by using precharge circuitry and sense amplifiers. The (MC+B) signals correspond to one column of memory, and one of the cell select transistors is chosen by means of a decoder or local memory bit. There are both area and speed advantages in using this style of implementation. The cell select transistors are of minimum size as opposed to the large pass transistors that would have been required if a direct connection between switch input and output were required. And using the sense amp, the read operation can be performed fast. Further, the precharge time of the memory can be interleaved with the dynamic logic module look-up time, thus shortening the interconnect delay even further. This would mean that the interconnect delay would be of the same magnitude as the logic module delay, and could be even smaller.

In another embodiment, one can assume that there are C dynamic logic modules 24, each with K inputs and 1 output. If the dynamic logic modules are divided into K classes, with C/K modules per class. A module in class j, j=1 ... K, is connected to the jth input of each dynamic logic module (instead of to every input). This will decrease the number of crosspoints and memory bit by a factor of K. It is possible to combine one or more of the foregoing approaches to develop a hybrid dynamic interconnection array 26.

In sum, it will be appreciated that an improved architecture for a field programmable logic device has been disclosed. The dynamically changing logic core and interconnection array of the invention facilitates the sharing of silicon resources, while simplifying the circuit implementation process since placement and routing of the circuit is straightforward. Another benefit associated with the invention is the improved timing performance and the associated benefit of being able to accurately predict timing performance.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of using a computing device for programming a field programmable logic device, said method comprising the steps of using said computing device for:

receiving a description of a circuit to be implemented in said field programmable logic device;

identifying logic levels within said circuit;

creating logic tables to execute the logic corresponding to each of said logic levels within said circuit;

producing input/buffer logic to select input values and buffered values to be applied to said logic tables;

generating buffer controller logic to enable the storage of buffered values at a first logic level which must be used at a subsequent logic level;

defining logic controller logic to enable the storage of input values and buffered values which are subsequently applied to said logic tables;

using said computing device for downloading said input/buffer logic, said buffer controller logic, and said logic controller logic through an interface structure to a non-volatile memory device; and connecting said non-volatile memory device to a field programmable logic device including a dynamically configurable logic cross bar structure, a logic cross bar controller, a dynamically changing logic core dynamically changing in time with each of said logic levels a buffer cross bar structure, and a buffer controller.

2. A field programmable logic device to implement a logic circuit that includes a first logic level to execute a first logic operation at a first instance, a second logic level to execute a second logic operation at a second instance and a third logic level to execute a third logic operation at a third instance, said field programmable logic device comprising:

a dynamically configurable logic cross bar structure including a grid of switching elements, said dynamically configurable logic cross bar structure including logic cross bar input lines connected to logic core output lines to receive first logic core output signals corresponding to output signals for said first logic level of said logic circuit, said dynamically configurable logic cross bar structure also including logic cross bar output lines connected to logic core input lines;

a logic cross bar controller to generate first control signals that are applied to said grid of switching elements of said dynamically configurable logic cross bar structure to form a first configuration of said grid of switching elements, which selects, from said first logic core output signals, second logic level input signals that are routed to said logic cross bar output lines, said second logic level input signals corresponding to input signals for said second logic level of said logic circuit; and a dynamically changing logic core connected to said logic core input lines and said logic core output lines, said dynamically changing logic core executing said second logic operation at said second instance on said second logic level input signals to generate second logic core output signals that are applied to said logic core output lines, said logic cross bar structure receiving said second logic core output signals and said logic cross bar controller generating second control signals that are applied to said grid of switching elements of said dynamically configurable logic cross bar structure to form a second configuration of said grid of switching elements, which selects from said second logic core output signals third logic level input signals that are routed to said logic cross bar output lines, said dynamically changing logic core executing said third logic operation at said third instance on said third logic level input signals.

3. The field programmable logic device of claim 2 wherein said dynamically changing logic core is a look-up table, said first logic level corresponding to a first set of values in said look-up table, said second logic level corresponding to a second set of values in said look-up table, and said third logic level corresponding to a third set of values in said look-up table.

4. The field programmable logic device of claim 3 wherein said dynamically changing logic core includes a counter for selecting said first set of values, said second set of value, and said third set of values.

5. The field programmable logic device of claim 2 further including a set of latches positioned between said logic cross bar output lines and said logic core input lines.

6. The field programmable logic device of claim 2 further including:

a buffer cross bar structure including a grid of switching elements, said buffer cross bar structure including buffer cross bar structure input lines connected to external input lines and buffer array output lines, said buffer cross bar structure also being connected to buffer cross bar structure output lines;

a buffer controller to generate control signals such that said buffer cross bar structure selects, from input signals on said buffer cross bar structure input lines, buffer cross bar output signals that are applied to said buffer cross bar structure output lines;

a set of buffer latches connected to said buffer cross bar output lines; and a buffer array connected to said buffer latches to store bypass signals, said buffer array producing output buffer array signals on said buffer array output lines.

7. The field programmable logic device of claim 6 wherein said buffer cross bar structure is also connected to buffer cross bar bypass lines that are connected to said dynamically configurable logic cross bar structure.

8. The field programmable logic device of claim 7 wherein said logic cross bar controller selects signals from said buffer cross bar bypass lines and routes them to said dynamically changing logic core.

9. The field programmable logic device of claim 6 further including a plurality of buffer array multiplexers connected between said buffer cross bar structure output lines and said buffer array input lines.

10. The field programmable logic device of claim 9 further including a plurality of logic cross bar structure through lines connected to said plurality of buffer array multiplexers.

11. The field programmable logic device of claim 10 wherein said plurality of buffer array multiplexers selects from said plurality of logic cross bar structure through lines and said buffer cross bar structure output lines signals to be applied to said buffer array.

12. The field programmable logic device of claim 6 further including a plurality of input multiplexers to select from said external input lines and said buffer array output lines signals to be applied to said buffer cross bar structure input lines.

13. A method of implementing a logic circuit in a field programmable logic device, wherein the logic circuit is of the type that includes a first logic level to execute a first logic operation at a first instance, a second logic level to execute a second logic operation at a second instance, and a third logic level to execute a third logic operation at a third instance, said method comprising the steps of:

receiving, at a dynamically configurable logic cross bar structure, first logic core output signals corresponding to output signals for said first logic level of said logic circuit;

using said dynamically configurable logic cross bar structure to select a subset of said first logic core output signals to form second logic level input signals corresponding to input signals for said second logic level of said logic circuit;

employing a dynamically changing logic core to execute said second logic operation at said second instance on said second logic level input signals to generate second logic core output signals;

using said dynamically configurable logic cross bar structure to select a subset of said second logic core output signals to form third logic level input signals; and employing said dynamically changing logic core to execute said third logic operation at said third instance on said third logic level input signals.

14. The method of claim 13 further comprising the steps of:

using a buffer cross bar structure to select input signals; and buffering said input signals to produce buffered signals.

15. The method of claim 14 wherein said using step includes the step of selecting input signals from data input signals and buffer array output signals.

16. The method of claim 14 further comprising the step of using said dynamically configurable logic cross bar structure to select logic level input signals from said buffered signals.

* * * * *